United States Patent
Lee et al.

(10) Patent No.: US 11,300,854 B2
(45) Date of Patent: Apr. 12, 2022

(54) LIGHT EMITTING MODULE, FLASH MODULE, AND TERMINAL INCLUDING SAME

(71) Applicant: SUZHOU LEKIN SEMICONDUCTOR CO., LTD., Taicang (CN)

(72) Inventors: Tae Sung Lee, Seoul (KR); Jang Hoon Jeong, Seoul (KR); Min Ji Jin, Seoul (KR); Young Kyu Jeong, Seoul (KR)

(73) Assignee: SUZHOU LEKIN SEMICONDUCTOR CO., LTD., Suzhou (CN)

(*) Notice: Subject to any disclaimer, the term of this patent is extended or adjusted under 35 U.S.C. 154(b) by 529 days.

(21) Appl. No.: 16/323,356

(22) PCT Filed: Aug. 8, 2017

(86) PCT No.: PCT/KR2017/008562
§ 371 (c)(1),
(2) Date: Feb. 5, 2019

(87) PCT Pub. No.: WO2018/030757
PCT Pub. Date: Feb. 15, 2018

(65) Prior Publication Data
US 2021/0286235 A1     Sep. 16, 2021

(30) Foreign Application Priority Data

Aug. 9, 2016 (KR) .................. 10-2016-0101280
Aug. 16, 2016 (KR) .................. 10-2016-0103696

(51) Int. Cl.
*G03B 15/05*     (2021.01)
*H01L 25/075*    (2006.01)
(Continued)

(52) U.S. Cl.
CPC .......... *G03B 15/05* (2013.01); *H01L 25/0753* (2013.01); *H01L 33/486* (2013.01);
(Continued)

(58) Field of Classification Search
CPC ............ G03B 15/05; G03B 2215/0592; G03B 2215/0567; H01L 33/50; H01L 33/486;
(Continued)

(56) References Cited

U.S. PATENT DOCUMENTS

2004/0201987 A1* 10/2004 Omata .................. H01L 33/486
                                                              362/230
2006/0187653 A1   8/2006 Olsson
(Continued)

FOREIGN PATENT DOCUMENTS

CN        1306629       3/2007
CN        102097423     6/2011
(Continued)

OTHER PUBLICATIONS

International Search Report (with English Translation) and Written Opinion dated Nov. 22, 2017 issued in Application No. PCT/KR2017/008562.
(Continued)

*Primary Examiner* — Donald L Raleigh
(74) *Attorney, Agent, or Firm* — Birch, Stewart, Kolasch & Birch, LLP

(57) ABSTRACT

An embodiment relates to a light emitting module, a flash module, and a terminal including the same. The light emitting module according to an embodiment comprises: a semiconductor layer; a phosphor layer arranged on one surface of the semiconductor layer; a plurality of light emitting chips including a plurality of electrodes arranged on a surface facing one surface of the semiconductor layer; a first partition arranged at one side of the plurality of light (Continued)

emitting chips, and a second partition arranged at the other side of the plurality of light emitting chips so as to face the first partition; and an opaque molding part, which encompasses the plurality of light emitting chips such that the upper surface of the phosphor layer and the bottom surfaces of the plurality of electrodes are exposed to the outside, and is arranged on the inner side of the first and second partitions. The light emitting module according to the embodiment comprises: a semiconductor layer; a phosphor layer arranged on one surface of the semiconductor layer; a plurality of light emitting chips including a plurality of electrodes arranged on a surface facing one surface of the semiconductor layer; and an opaque molding part, which encompasses the plurality of light emitting chips such that the upper surface of the phosphor layer and the bottom surfaces of the plurality of electrodes are exposed to the outside.

18 Claims, 14 Drawing Sheets

(51) Int. Cl.
  *H01L 33/48* (2010.01)
  *H01L 33/50* (2010.01)
  *H01L 33/58* (2010.01)
  *H04M 1/02* (2006.01)
(52) U.S. Cl.
  CPC .............. *H01L 33/50* (2013.01); *H01L 33/58* (2013.01); *G03B 2215/0567* (2013.01); *G03B 2215/0592* (2013.01); *H04M 1/0264* (2013.01)
(58) Field of Classification Search
  CPC ... H01L 33/58; H01L 25/0753; H04M 1/0264
  See application file for complete search history.

(56) References Cited

U.S. PATENT DOCUMENTS

| | | |
|---|---|---|
| 2008/0308824 A1 | 12/2008 | Shchekin et al. |
| 2010/0178046 A1 | 7/2010 | Moon et al. |
| 2011/0114979 A1 | 5/2011 | Jang |
| 2011/0193108 A1* | 8/2011 | Wu ..................... H01L 25/0753 257/89 |
| 2011/0266576 A1* | 11/2011 | Engl ....................... H01L 33/58 257/98 |
| 2016/0225959 A1 | 8/2016 | Pan et al. |
| 2017/0104141 A1* | 4/2017 | Park ..................... H01L 33/486 |
| 2018/0019386 A1 | 1/2018 | Lee et al. |

FOREIGN PATENT DOCUMENTS

| | | |
|---|---|---|
| CN | 204592956 U | 8/2015 |
| CN | 205350927 | 6/2016 |
| JP | 2004-327955 | 11/2004 |
| JP | 2010-040801 | 2/2010 |
| KR | 20-0408497 | 2/2006 |
| KR | 10-0700063 | 3/2007 |
| KR | 10-2010-0049023 | 5/2010 |
| KR | 10-2010-0118623 | 11/2010 |
| KR | 10-2016-0014968 | 2/2016 |
| KR | 10-2016-0080089 | 7/2016 |
| KR | 10-2016-0089293 | 7/2016 |

OTHER PUBLICATIONS

Chinese Office Action dated Aug. 28, 2020 issued in Application No. 201780049327.X.

* cited by examiner

LIGHT EMITTING MODULE, FLASH MODULE, AND TERMINAL INCLUDING SAME

CROSS-REFERENCE TO RELATED PATENT APPLICATIONS

This application is a U.S. National Stage Application under 35 U.S.C. § 371 of PCT Application No. PCT/KR2017/008562, filed Aug. 8, 2017, which claims priority to Korean Patent Application No. 10-2016-0101280, filed Aug. 9, 2016, and Korean Patent Application No. 10-2016-0103696, filed Aug. 16, 2016, whose entire disclosures are hereby incorporated by reference.

TECHNICAL FIELD

Embodiments relate to a light emitting module, a camera flash, and a terminal including the same.

BACKGROUND ART

Semiconductor devices including compounds such as GaN and AlGaN have many merits such as wide and easy bandgap energy, and can be used variously as light emitting devices, light receiving devices, and various diodes.

Particularly, a light emitting device such as a light emitting diode or a laser diode using a semiconductor material of Group III-V or Group II-VI compound semiconductors can be applied to various devices such as a red, blue, and ultraviolet rays. By using fluorescent materials or combining colors, it is possible to implement a white light beam with high efficiency. Also, compared to conventional light sources such as fluorescent lamps and incandescent lamps, it has several advantages such as low power consumption, speed, safety, and environmental friendliness.

In addition, when a light-receiving element such as a photodetector or a solar cell is manufactured using a semiconductor material of Group III-V or Group II-VI compound semiconductor, since development of an element material absorbs light in various wavelength regions to generate a photocurrent, it is possible to use light in various wavelength ranges from gamma rays to radio wave regions.

It also has advantages of fast response speed, safety, environmental friendliness and easy control of device materials, so it can be easily used for power control or microwave circuit or communication module.

Accordingly, it can be extended to a transmission module of the optical communication means, a light emitting diode backlight replacing a cold cathode fluorescent lamp (CCFL) constituting a backlight of an LCD (Liquid Crystal Display) display device, a white light emitting diode Lighting devices replacing fluorescent lamp or white bulb, automotive headlights, traffic lights, and gas and fire sensors.

Further, applications can be extended to high frequency application circuits, other power control devices, and communication modules.

In recent years, the number of portable terminals with camera functions is increasing.

In such a portable terminal, a camera flash is built in to provide the amount of light required when photographing a camera.

In this regard, a light emitting module is employed as a light source of a camera flash. As such a light emitting module, the use of semiconductor devices such as a white LED (Light Emitting Diode) has been increasing.

Recently, in order to cope with the trend of technological development of such a mobile phone camera, there has been developed a technology for converting a camera of a mobile phone, for example, a mobile phone into a dual camera) is also required to implement a wide angle to correspond to the field of view (FOV) of a camera.

On the other hand, according to the related art, it is difficult to implement the angle of view (FOV) of the camera flash (Flash) at 90 degrees or more.

However, the slimness and the trend of the portable terminal continue with the demand of the industry requiring such a wide angle of view angle, and in the conventional camera flash module, since the flash lens needs to be maintained at a certain thickness or more, there is a problem in that it cannot satisfy the slim trend demand while maintaining the wide angle.

In addition, according to the related art, since the lens of the camera flash is injected using a mold, a round is formed at the end portion of the pattern of the lens. Since this rounding is performed by screening for the inner product, there is a problem that the limitation of the screening and the freedom of the optical design are restricted.

Also, according to the related art, there is an issue of scratch vulnerability of the lens of the camera flash.

For example, since the material of the lens portion exposed to the outside in the camera flash of the related art is formed of a plastic material, there is a problem that the lens portion is vulnerable to scratches during fabrication or use.

In addition, there is a problem of reliability reduction due to high heat generation in a flash operation in a light emitting module of a camera flash of the related art.

In addition, according to the related art, it is important that a uniform light distribution should be implemented in a camera imaging region even if a wide angle is implemented, also it is difficult to implement a wide angle and there is a technical contradiction that a uniform light distribution cannot be implemented at the same time with a wide angle.

Particularly, in the conventional lighting technology, a variety of emotional lighting using warm-white and cool-white light emitting modules is required, but in the field of camera flash technology, the emotional lighting cannot be implemented.

Further, according to the related art, as the process of attaching the flash lens to a separate terminal cover proceeds with the SMT (Surface Mounting Technology) process of the light emitting module package, the SMT tolerance and the tolerance when attaching the lens are increased, there is a problem that the alignment accuracy of the chip and the flash lens is lowered so that a uniform light distribution cannot be implemented.

Further, according to the camera flash of the related art, there is a problem that the coupling relation between the light emitting module and the frame is not robust and the mechanical reliability is deteriorated.

SUMMARY OF THE INVENTION

One of the technical problems of the embodiment is to provide a slim flash module, a camera flash, and a terminal including the same, while maintaining a wide angle.

Further, one of the technical problems of the embodiment is to provide a flash module, a camera flash, and a terminal including the same whose end portion of the pattern of the lens is a sharp.

Also, one of the technical problems of the embodiments is to provide a flash module, a camera flash, and a terminal including the flash module with a lens portion having high scratch resistance.

In addition, one of the technical problems of the embodiments is to provide a warm-white and cool-white integrated light emitting module, a flash module, a camera flash, and a terminal including the same.

Also, one of the technical problems of the embodiment is to provide a light emitting module, a flash module, a camera flash, and a terminal including same being excellent in reliability according to a high heat radiation effect in a flash operation of the light emitting module.

Also, one of the technical problems of the embodiments is to provide a light emitting module, a flash module, a camera flash, and a terminal including the same which can implement a uniform light distribution with high alignment accuracy between the light emitting chip and the flash lens.

It is another object of the embodiments to provide a light emitting module, a flash module, a camera flash, and a terminal including the same having a strong coupling relationship between the light emitting module and the frame.

A light emitting module according to an embodiment of the present invention includes a semiconductor layer, a phosphor layer disposed on one surface of the semiconductor layer, a plurality of light emitting chips including a plurality of electrodes disposed on a surface facing the one surface of the semiconductor layer, a first partition disposed on one side of the plurality of light emitting chips, a second partition disposed on the other side of the plurality of light emitting chips so as to face the first partition; and an opaque molding part surrounding the plurality of light emitting chips so that the upper surface of the phosphor layer and the bottom surface of the plurality of electrodes are exposed to an outside, and the opaque molding part disposed inside the first and second partitions.

In an embodiment, the first partition and the second partition surround the plurality of light emitting chips, the plurality of light emitting chips may include a first light emitting chip and a second light emitting chip having different color temperatures (CCT).

The first light emitting chip may include a first phosphor layer disposed on an upper surface of the first semiconductor layer, a first n-type electrode and a first p-type electrode disposed on a bottom surface of the first semiconductor layer, at least some of the bottom surfaces of the first n-type electrode and the first p-type electrode may be exposed to the bottom surface of the opaque molding part.

The light emitting module according to the embodiment includes the first light emitting chip, the second light emitting chip, and the first light emitting chip, which are spaced apart from each other with different color temperatures (CCT) and an opaque molding part surrounding the sides of the first light emitting chip and the second light emitting chip.

The first light emitting chip and the second light emitting chip may be flip-type light emitting chips, and the electrode of the first light emitting chip or the electrode of the second light emitting chip may be exposed to the bottom surface of the opaque molding part.

Wherein the first light emitting chip comprises: a first phosphor layer disposed on an upper surface of the first semiconductor layer; a first n-type electrode and a first p-type electrode disposed on a bottom surface of the first semiconductor layer and at least a part of the bottom surfaces of the first n-type electrode or p-type electrode may be exposed to the bottom surface of the opaque molding part.

The embodiment may further include a first partition and a second partition spaced apart from each other, and the first light emitting chip and the second light emitting chip may be disposed between the first partition and the second partition.

The second light emitting chip may include a second phosphor layer disposed on an upper surface of the second semiconductor layer, a second n-type electrode and a second p-type electrode disposed on the bottom surface of the second semiconductor layer.

The phosphor content of the first phosphor layer of the first light emitting chip and the content of the second phosphor layer of the second light emitting chip may be different from each other.

The second light emitting chip may further include an n-type pad electrode electrically connecting the second n-type electrode and a predetermined n-type semiconductor layer in the second semiconductor layer; and a p-type pad electrode disposed on the second p-type electrode.

The embodiment may further include a diffusion layer on the upper surface of the first light emitting chip and the second light emitting chip.

The diffusion layer may be disposed on the first light emitting chip and the second light emitting chip, and may not be disposed on the first and second partitions.

A flash module according to an embodiment includes a plurality of light emitting chips including a semiconductor layer, a phosphor layer disposed on one surface of the semiconductor layer, and a plurality of electrodes disposed on a surface facing the one surface of the semiconductor layer, a light emitting module including an opaque molding part enclosing the plurality of light emitting chips so that a top surface and a bottom surface of the plurality of electrodes are exposed to the outside; a frame disposed on the light emitting module; and a lens unit disposed on the frame.

The light emitting module may include a first partition and a second partition spaced apart from each other, and the flip-type first light emitting chip and the flip-type second light emitting chip disposed between the first partition and the second partition.

The flip-type first light emitting chip and the flip-type second light emitting chip may have different color temperatures (CCTs).

A flash module according to an embodiment of the present invention includes first and second spaced apart partitions, a first light emitting chip and a second light emitting chip disposed between the first partition and the second partition, a light emitting module including opaque molding parts disposed between the partitions, a frame disposed on the light emitting module, and a lens part disposed on the frame.

The first light emitting chip and the second light emitting chip may be flip-type light emitting chips.

A part of the flip-type first light emitting chip or the flip-type second light emitting chip may be exposed to the bottom surface of the opaque molding part.

The flip-type first light emitting chip may include a first phosphor layer disposed on an upper surface of the first semiconductor layer, a first n-type electrode and a first p-type electrode disposed on a bottom surface of the first semiconductor layer.

At least some of the bottom surfaces of the first n-type electrode and the first p-type electrode may be exposed to the bottom surface of the opaque molding part.

Further, the frame may include a first frame and a second frame whose cross-sections are mutually spaced, and the light emitting module may be disposed between the first frame and the second frame.

The first frame may include a first support portion and a first inner protrusion portion disposed on the first support portion.

The second frame may include a second support portion and a second inner protrusion portion disposed on the second support portion.

The first partition and the second partition of the light emitting module may be in contact with an inner surface of the first support portion and an inner surface of the second support portion.

The first partition and the second partition of the light emitting module may be in contact with a bottom surface of the first inner protruding portion and a bottom surface of the second inner protruding portion.

Also, the first frame may include a third inner protruding portion disposed on the first inner protruding portion and a first outer protruding portion disposed on the third inner protruding portion.

The second frame may include a fourth inner protruding portion disposed on the second inner protruding portion and a second outer protruding portion disposed on the fourth inner protruding portion.

The lens portion may be in contact with the third inner protruding portion and the fourth inner protruding portion.

The height of the upper surface of the lens unit may be the same as the height of the upper surface of the frame.

Further, the frame may include a predetermined recess on the outer side in the linear direction passing through the flip-type first light emitting chip and the flip-type second light emitting chip.

In addition, the embodiment may further include a diffusion layer 134 on the flip-type first light emitting chip and the flip-type second light emitting chip.

The diffusion layer may be disposed on the flip-type first light emitting chip and the flip-type second light emitting chip, and may not be disposed on the first and second partitions.

A flash module according to an embodiment includes a plurality of light emitting chips including a semiconductor layer, a phosphor layer disposed on one surface of the semiconductor layer, and a plurality of electrodes disposed on a surface facing one surface of the semiconductor layer, and a molding part for surrounding the plurality of light emitting chips so that a bottom surface of the light emitting chip is exposed to the outside and a frame disposed on the light emitting module; and a lens unit disposed on the frame.

The lens unit may include a light diffusion unit in which a predetermined pattern is disposed, and a lens support unit disposed in contact with the outside of the light diffusion unit.

The light diffusion unit may include a glass material.

The light diffusing unit of the lens unit may include a pattern unit in which the pattern is disposed and a light output unit through which light emitted from the light emitting chip is emitted.

The light output portion may include the glass material.

The molding part may include an opaque molding part.

The light emitting module may include a first partition and a second partition spaced apart from each other, and the flip-type first light emitting chip and the flip-type second light emitting chip disposed between the first partition and the second partition.

The flip-type first light emitting chip and the flip-type second light emitting chip may have different color temperatures (CCTs).

The flip-type first light emitting chip may include a first phosphor layer disposed on an upper surface of the first semiconductor layer, a first n-type electrode and a first p-type electrode disposed on a bottom surface of the first semiconductor layer.

At least some of the bottom surfaces of the first n-type electrode and the first p-type electrode may be exposed to the bottom surface of the opaque molding part.

Further, the frame may include a first frame and a second frame whose cross-sections are mutually spaced, and the light emitting module may be disposed between the first frame and the second frame.

The first frame may include a first support portion and a first inner protrusion portion disposed on the first support portion.

The second frame may include a second support portion and a second inner protrusion portion disposed on the second support portion.

The first partition and the second partition of the light emitting module may be in contact with an inner surface of the first support portion and an inner surface of the second support portion.

The height of the upper surface of the lens unit may be the same as the height of the upper surface of the frame.

The flash module according to the embodiment may include the light emitting module.

The terminal according to the embodiment may include the flash module or the light emitting module.

Advantageous Effects

Embodiments can provide a super slim light emitting module, a camera module, and a terminal including the same, while maintaining a wide angle.

Also, the embodiment can provide a flash module, a camera module and a terminal including the same, wherein the end portion of the pattern of the lens has a sharp technical characteristic.

In addition, the embodiment can provide a flash module, a camera module, and a terminal including the flash module with a lens portion having high scratch resistance.

In addition, embodiments can provide a warm-white and cool-white integrated light emitting module, a camera module, and a terminal including the same capable of implementing emotional lighting in the camera flash technology area.

In addition, the embodiment can provide a light emitting module, a camera module, and a terminal including the light emitting module excellent in reliability according to a high heat radiation effect in a flash operation of the light emitting module.

Also, the embodiment can provide a light emitting module, a camera module, and a terminal including the same, which can implement a uniform light distribution with high alignment accuracy between the light emitting chip and the flash lens.

In addition, the embodiment can provide a light emitting module, a camera module, and a terminal including the same, wherein the coupling relation between the light emitting module and the frame is strong and the mechanical reliability is improved.

DETAILED DESCRIPTION

Hereinafter, embodiments that can be specifically implemented for solving the above problems will be described with reference to the accompanying drawings.

In describing an embodiment, when it is described as being formed "on or under" of each element, an upper or lower (on or under) wherein both elements are directly contacted with each other or one or more other elements are indirectly formed between the two elements.

Also, when expressed as "on or under", it may include not only an upward direction but also a downward direction with respect to one element.

The semiconductor device may include various electronic devices such as a light emitting device and a light receiving device. The light emitting device and the light receiving device may include the first conductivity type semiconductor layer, the active layer, and the second conductivity type semiconductor layer.

The semiconductor device according to the embodiment may be a light emitting device.

The light emitting device emits light by recombination of electrons and holes, and the wavelength of the light is determined by the energy band gap inherent to the material.

Thus, the light emitted may vary depending on the composition of the material.

The light emitting chip of the embodiment may be a flip-type light emitting chip, but the embodiment is not limited thereto.

Embodiment 1

Figure 1:
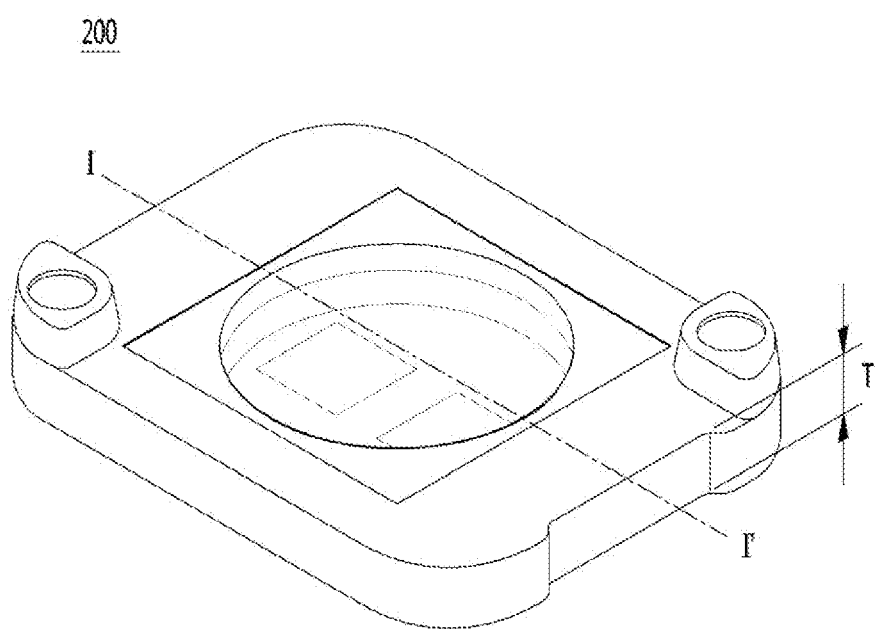
FIG. 1 is a perspective view of a flash module according to a first embodiment.
Figure 2:
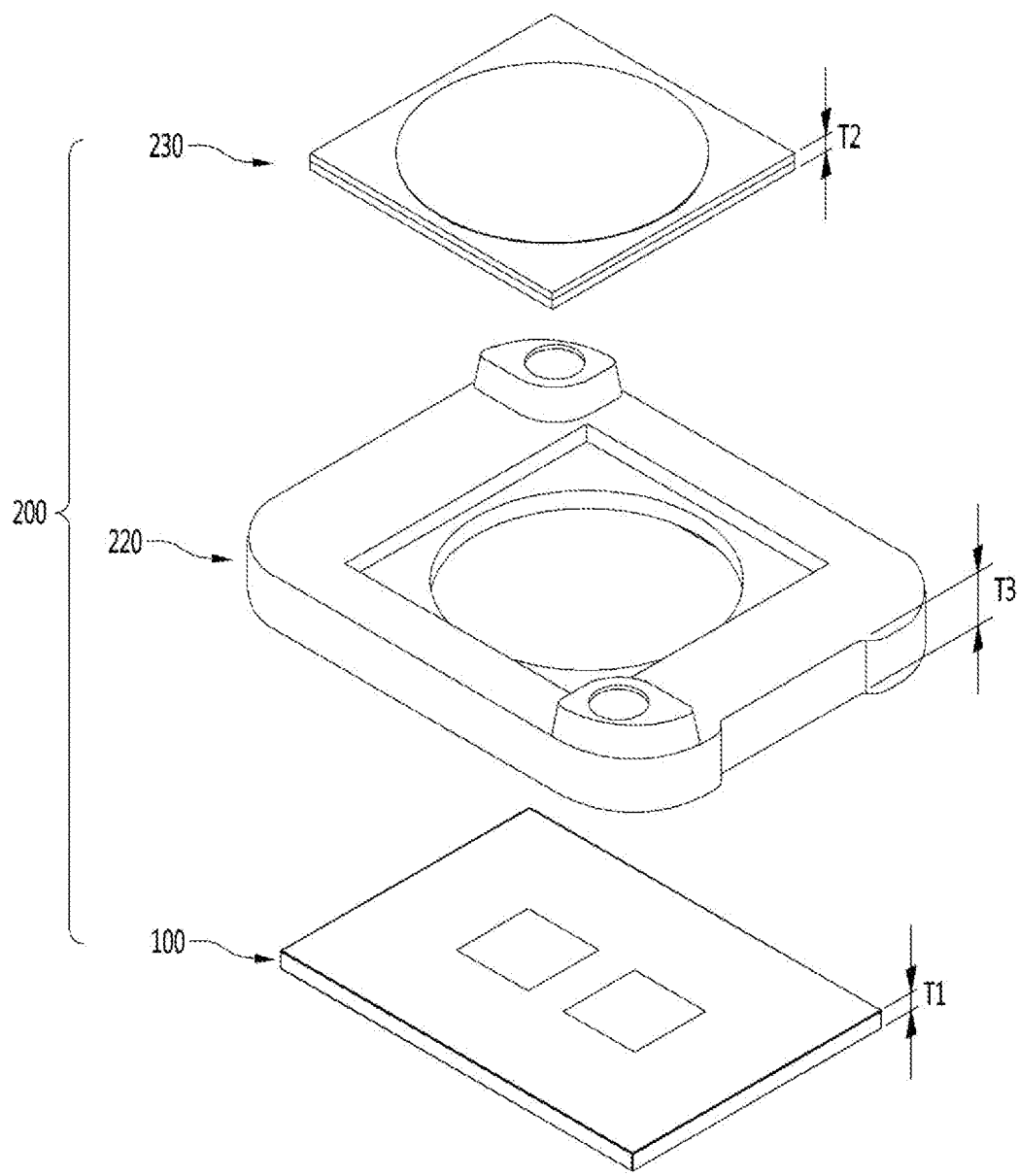
FIG. 2 is an exploded perspective view of the flash module according to the first embodiment.

FIG. 1 is a perspective view of a flash module 200 according to a first embodiment, and FIG. 2 is an exploded perspective view of a flash module 200 according to a first embodiment.

Referring to FIG. 2, the flash module 200 according to the first embodiment may include a frame 220, a light emitting module 100, and a lens unit 230.

For example, the flash module 200 according to the first embodiment includes a light emitting module 100, a frame 220 disposed on the light emitting module 100, a lens unit 230 disposed on the frame.

Embodiments of the present invention provide a super slim light emitting module, a camera module, and a terminal including the super slim light module while maintaining a wide angle.

A camera module capable of maintaining a wide angle will be firstly described with reference to FIGS. 4A and 4B.

Figure 4A:
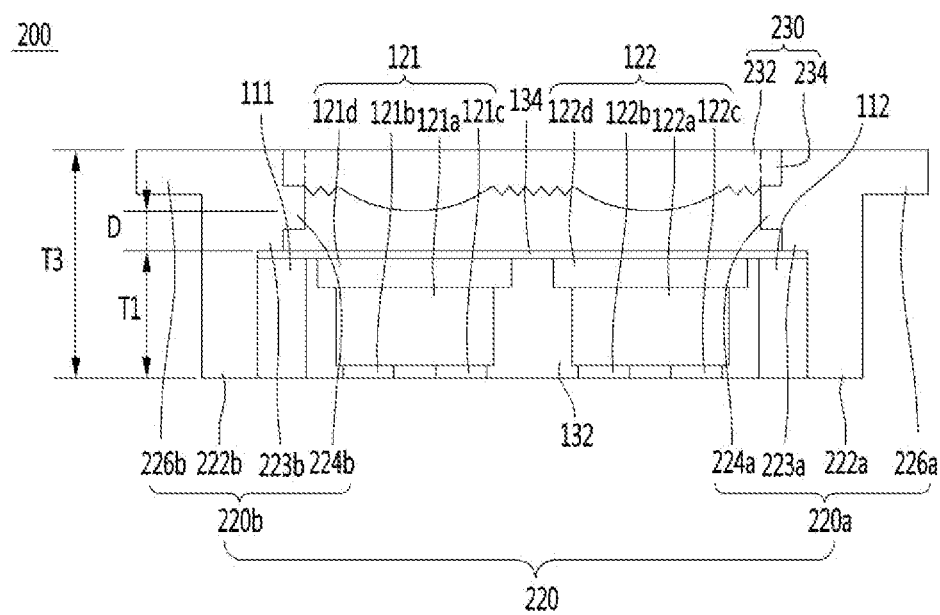
FIG. 4A is a cross-sectional view of the flash module according to the first embodiment.

FIG. 4A is a cross-sectional view of the flash module 200 according to the first embodiment. The flash module 200 of the first embodiment includes a light emitting module 100 including a first light emitting chip 121 and a second light emitting chip 122, a frame 220, and a lens unit 230. The first light emitting chip 121 and the second light emitting chip 122 of the embodiment may be flip-type light emitting chips, but the embodiment is not limited thereto.

Figure 4B:
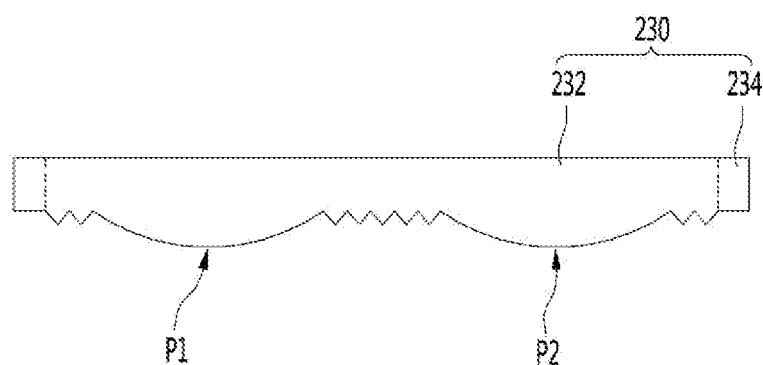
FIG. 4B is an enlarged cross-sectional view of the lens portion in the flash module according to the first embodiment.

FIG. 4B is an enlarged cross-sectional view of the lens portion 230 in the flash module according to the first embodiment.

The lens unit 230 mounted on the flash module 200 according to the first embodiment includes a plurality of light diffusion patterns P1 and P2 so that the first light emitting chip 121 and the second light emitting chip 122 emit light (FOV) can be implemented by increasing the light diffusion of the light.

For example, when two light emitting chips such as the first light emitting chip 121 and the second light emitting chip 122 are provided in the light emitting module, the first light diffusion pattern P1, the second light diffusion pattern P2 can be included, but it is not limited thereto.

When there are four light emitting chips, four light diffusion patterns may be provided.

According to the current technology of wide-angle camera, the angle of view (FOV) of the flash module required in the industry is in a situation in which a wide angle of about 120° or more is required continuously as a dual camera is continuously developed. Further, attributes of uniform light distribution at a wide angel must also be implemented at the same time.

According to the embodiment, the angle of view (FOV) of the camera flash can be implemented up to 120°, and it can be implemented up to 135°.

According to the embodiment, as the degree of coincidence between the distribution of light emitted from the first light emitting chip 121 and the second light emitting chip 122, and the degree of coincidence of the light diffusion pattern of the lens portion 230 is higher, and a uniform light distribution can be obtained at the same time.

For example, in the embodiment, the center of each light diffusion pattern and the center of each light emitting chip in the top view of the lens unit 230 can be matched.

For example, in the embodiment, by controlling the light diffusion pattern of the lens part 230 and the alignment tolerance of the light emitting chip to be about 25 Lim or less, the directivity characteristics of the light emitted from the light emitting chip and the matching of the light diffusion pattern of the lens part can be improved, thereby a uniform light distribution can be obtained in addition to the implementation of the wide angle view angle (FOV).

Next, with reference to FIG. 4A, description will be described of a technical solution for a super slim light emitting module and a camera module.

In the related art, the thickness of the flash module including the lens portion is about 2.5 mm or more, and it is difficult to reduce the thickness.

This is because, in the related art, after the SMT operation of the light emitting module on the package substrate, the lens is separately attached to the camera cover case, thereby limiting the thickness of the camera flash module.

Further, according to the applicant's recent unpublished internal technology, the lens portion is formed into an injection structure in the frame. Thus, even if the thickness of the camera flash module is made as thin as possible, about 1.4 mm is the limit of the internal technology.

The flash module 200 according to the embodiment of the present invention can be super slim the thickness T of the flash module to a thickness of about 1 mm or less beyond the technical limit.

This is because the thickness T1 of the light emitting module can be reduced in the flash module 200 and the light emitting module 100 is disposed inside the frame 220 and the lens unit 230 is disposed inside the frame 220.

That is, the thickness of the flash module 200 according to the embodiment may be the thickness T3 of the frame, and the thickness T of the flash module may be slimly reduced.

For example, the thickness (T) of the flash module can be reduced to about 0.85 mm or less.

In addition, the embodiment can achieve ultra-slimming even when the thickness T of the flash module is about 0.65 mm or less.

The thickness T2 of the lens portion 230 can be controlled to be about ⅓ or less of the thickness T3 of the frame 220 in the embodiment.

For example, the thickness T2 of the lens portion 230 can be controlled to be about 0.30 mm or less.

The embodiment can control the thickness T2 of the lens portion 230 to about 0.20 mm or less.

In addition, the thickness T1 of the light emitting module 100 may be controlled to be about ⅓ or less of the thickness of the frame 220 in the embodiment.

In particular, since the light emitting module 100 can be formed without a circuit board in the light emitting module 100, the thickness T1 of the light emitting module 100 can be reduced.

For example, the thickness T1 of the light emitting module 100 can be controlled to be about 0.30 mm or less.

The embodiment can control the thickness T1 of the light emitting module 100 to be ultra slim to about 0.25 mm or less.

Accordingly, embodiments can provide a super slim light emitting module, a camera module, and a terminal including the same, while maintaining a wide angle of view.

Referring again to FIG. 3, FIG. 3 is a plan view of the flash module 200 according to the first embodiment.

Figure 3:
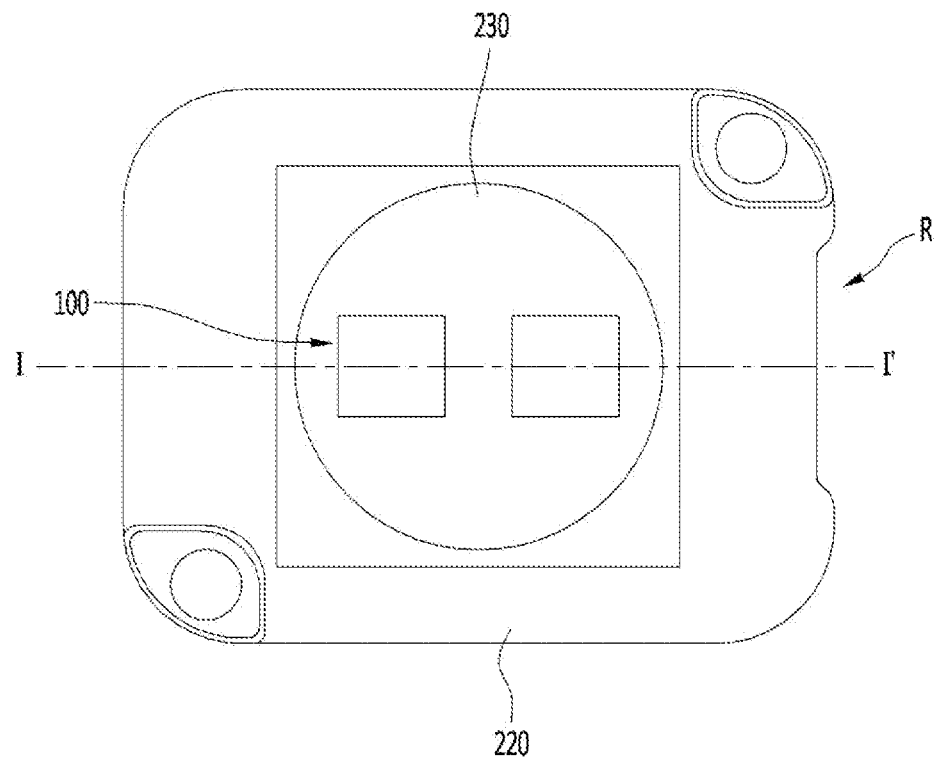
FIG. 3 is a plan view of the flash module according to the first embodiment.

Referring to FIG. 3, the frame 220 is disposed on the outside of the linear direction I-I' passing through the first light emitting chip 121 and the second light emitting chip 122 of the light emitting module 100 in the first embodiment and may include a predetermined recess (R).

In the light emitting module 100 of the embodiment, the first light emitting chip 121 may emit a warm-white light, and the second light emitting chip 122 may emit a cool-white light.

Accordingly, embodiments of the present invention can provide a warm-white and cool-white integrated camera module capable of implementing emotional lighting in a camera flash technology area, and a terminal including the camera module.

Meanwhile, in the embodiment, by including the recess R on the outside of the linear direction I-I' passing through the first light emitting chip 121 and the second light emitting chip 122, for example, the first light emitting chip 121 or the second light emitting chip 122 can be identified by providing the recesses R on the side adjacent to the first light emitting chip 122 and the warm light emitting chip 121 or the second light emitting chip 122, cool-white integrated camera module, it is easy to mount each light emitting chip, and it is possible to easily control the operation of each light emitting chip when the camera module is used later.

Hereinafter, the technical features of the flash module 200 according to the first embodiment will be described in more detail with reference to FIGS. 4A, 4B and 5.

Referring to FIG. 4A, the flash module 200 of the first embodiment may include a frame 220 disposed on the light emitting module 100, and a lens portion 230 disposed on the frame 220.

Figure 5:
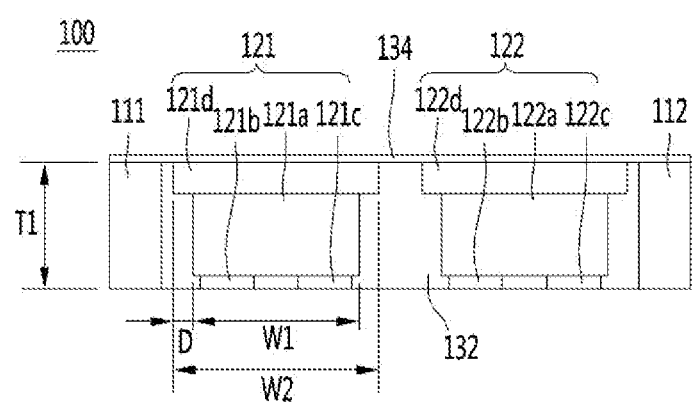
FIG. 5 is a sectional view of a light emitting module in a flash module according to the first embodiment.

For example, referring to FIG. 5, in the flash module 200 of the first embodiment, the light emitting module 100 includes a first partition 111 and a second partition 112 spaced apart from each other, a first light emitting chip 121 and a second light emitting chip 122 disposed between the first partition 111 and the second partition 112 and a second light emitting chip 122 disposed between the first partition 111 and the second partition 112, and an opaque molding part 132.

The first partitions 111 and the second partitions 112 may be formed of a metal material.

For example, the first partition 111 and the second partition 112 may be formed of copper (Cu), aluminum (Al), or the like, but it is not limited thereto.

The first partitions 111 and the second partitions 112 may be formed of a non-metallic material such as polyimide.

The first partition 111 and the second partition 112 may be formed in a manner that the first light emitting chip 121 and the second light emitting chip 122 are formed without a separate circuit board for the light emitting module itself and has a main function for forming the opaque molding part 132.

In order to form such a light emitting module 100, a first partition 111 and a second partition 112 are formed on a predetermined support layer 190 (see FIG. 8), and a first light emitting chip 121. The light emitting module 100 may be formed by disposing the second light emitting chip 122 and injecting the opaque molding part 132 and then removing the support layer 190, but it is not limited thereto.

The opaque molding part 132 may include a white mold, but it is not limited thereto.

For example, the opaque molding part 132 may be a white mold composition in which an oxide such as $TiO_2$ is dispersed in silicone, but it is not limited thereto.

In the embodiment, the opaque molding part 132 can prevent the light emitted from the first light emitting chip 121 and the second light emitting chip 122 from being mixed with each other, uniform white color can be implemented.

In the flash module 200 of the embodiment, a part of the first light emitting chip 121 or the second light emitting chip 122 may be exposed to the bottom of the opaque molding part 132.

For example, the first light emitting chip 121 includes a first phosphor layer 121d disposed on the top surface of the first semiconductor layer 121a, a first n-type electrode 121b and a first p-type electrode 121c disposed on the bottom surface of the first semiconductor layer 121a.

At this time, a part of each of the bottom surfaces of the first n-type electrode 121b and the first p-type electrode 121c may be exposed to the bottom surface of the opaque molding part 132.

The second light emitting chip 122 includes a second phosphor layer 122d disposed on the upper surface of the second semiconductor layer 122a and a second n-type electrode 122b, a second p-type electrode 122c disposed on the bottom surface of the second semiconductor layer 122a.

At this time, a part of each of the bottom surfaces of the second n-type electrode 122b and the second p-type electrode 122c may be exposed to the bottom surface of the opaque molding part 132.

The first semiconductor layer 121a and the second semiconductor layer 122a may be formed of a compound semiconductor such as a semiconductor compound, for example, a Group III-V, a Group II-VI, or the like.

The first semiconductor layer 121a and the second semiconductor layer 122a may be a light emitting structure layer including a first conductivity type semiconductor layer, an active layer, and a second conductivity type semiconductor layer, but it is not limited thereto.

For example, when the first conductivity type semiconductor layer is an n-type semiconductor layer, the n-type dopant group may be doped. When the second conductivity type semiconductor layer is a p-type semiconductor layer, a p-type dopant group may be doped.

In the related art, the thickness of the flash module including the lens portion is about 2.5 mm or more, and it is difficult to reduce the thickness.

This is because, in the related art, after the SMT operation of the light emitting module on the package substrate, the lens is separately attached to the camera cover case to limit the thickness of the camera flash module.

In particular, in the related art, the light emitting module has a limitation in reducing the thickness of the light emitting module itself, as the light emitting chip is SMTed on a predetermined substrate, for example, a PCB.

In addition, since the light emitting module occupies an extra thickness in addition to the thickness of the frame of the flash module in the related art, there is a technical limitation in reducing the thickness of the entire flash module.

However, the flash module 200 according to the embodiment can dramatically overcome such a technical limitation and slim the thickness T of the flash module to a thickness of about 1 mm or less.

This is because the thickness T1 of the light emitting module 100 in the flash module 200 is reduced and the light emitting module 100 is disposed inside the frame 220 and the lens unit 230 can be disposed.

The thickness T1 of the light emitting module 100 can be controlled to be about ⅓ or less of the thickness T3 of the frame 220 in the embodiment.

Particularly, in the embodiment, since the light emitting module 100 can be formed without a circuit board in the light emitting module 100 itself, the thickness T1 of the light emitting module can be innovatively reduced.

For example, the thickness T1 of the light emitting module 100 can be controlled to be about 0.30 mm or less.

The embodiment can control the thickness T1 of the light emitting module 100 to be extremely slim up to about 0.25 mm or less.

Accordingly, the embodiment can provide a very slim light emitting module, a camera module, and a terminal including the same, while maintaining a wide angle of view angle.

Also, in the embodiment, the frame 220 may include a first frame 220a and a second frame 220b having mutually separated cross sections.

The frame 220 may include a first support portion 222a and a second support portion 222b having mutually separated cross sections.

The frame 220 may be formed of a resin-based insulating material, for example, a resin material such as polyphthalamide (PPA), or a ceramic material.

Further, the frame 220 may be formed of a thermosetting resin including silicon, epoxy resin, or plastic material, or a high heat-resistant, high-light-resistant material.

The above silicon may include a white-based resin.

The frame 220 may be formed of W-EMC, W-Silicone, polycarbonate, or the like.

At this time, the light emitting module 100 may be disposed between the first frame 220a and the second frame 220b.

A predetermined adhesive material may be formed between the first partition 111 and the first frame 220a of the light emitting module 100 and between the second partition 112 and the second frame 220b.

For example, white silicon may be applied between the first partition 111 and the first frame 220a of the light emitting module 100 and between the second partition 112 and the second frame 220b, but it is not limited thereto.

Accordingly, since the light emitting module 100 is disposed inside the frame, the thickness of the light emitting module 100 itself may not cause the thickness of the entire flash module 200 to increase.

The thickness of the flash module 200 according to the embodiment can be made to be the thickness T3 of the frame 220 so that the thickness T of the flash module can be slimly reduced.

For example, the thickness T of the flash module can be reduced to about 0.85 mm or less.

In addition, the thickness T of the flash module can be reduced to about 0.65 mm or less.

Of course, if the thickness of the frame 220 itself is reduced, the thickness of the flash module can be further reduced.

Also, it is an object of the present invention to provide an integrated light emitting module, a camera module, and a terminal including the same, which considers emotional illumination in the camera flash technology field.

FIG. 5, the first light emitting chip 121 includes a first phosphor layer 121d disposed on the top surface of the first semiconductor layer 121a, and a first n-type electrode 121b and a first p-type electrode 121c disposed on the bottom surface of the first semiconductor layer 121a.

The second light emitting chip 122 includes a second phosphor layer 122d disposed on the upper surface of the second semiconductor layer 122a, and a second n-type electrode 122b, a second p-type electrode 122c disposed on the bottom surface of the second semiconductor layer 122a.

At this time, the color temperature (CCT) of the first light emitting chip 121 and the color temperature (CCT) of the second light emitting chip 122 may be different from each other.

For example, the first light emitting chip 121 may emit a warm-white light and the second light emitting chip 122 may emit a cool-white light.

For example, the first light emitting chip 121 may emit a warm-white light of about 3,000 K, and the second light emitting chip 122 may emit a cool-white light of about 5,000 K cool-white.

For example, when the first light emitting chip 121 of the embodiment is a blue light emitting chip, the relative proportion of the blue light can be lowered by increasing the proportion of the phosphor in the first phosphor 121d to implement warm-white.

When the second light emitting chip 122 of the embodiment is a blue light emitting chip, the relative proportion of the blue light may be increased by lowering the ratio of the phosphor in the second phosphor 122d to achieve cool-white, but it is not limited thereto.

Embodiments can provide an integrated light emitting module, a camera module, and a terminal including the same, which can emit light through warm-white and cool-white light emission in a camera flash technology area.

In the embodiment, the first phosphor 121d or the second phosphor 122d may be a yellow phosphor, but it is not limited thereto.

For example, the yellow phosphor may be, but not limited to, YAG.

In addition, in the embodiment, the first phosphor 121d or the second phosphor 122d may be a composite phosphor of a red phosphor and a green phosphor.

For example, the red phosphor may include, but it is not limited to, a compound-based phosphor such as (Ca, sr) S: Eu2+ or a nitride-based phosphor such as CaAlSiN3:Eu2+ phosphor.

The green phosphor may include at least of (Y,Gd,Lu,Tb) 3(Al,Ga)5O12:Ce, (Mg,Ca,Sr,Ba)2SiO4:Eu, (Ca,Sr)3SiO5: Eu, (La,Ca)3 Si6N11:Ce, α-SiAlON:Eu, β-SiAlON:Eu, but it is not limited thereto.

The horizontal width of the phosphor layer is formed to be larger than the horizontal width of the epi-semiconductor layer of the light emitting chip in the embodiment, so that the light emitted from the light emitting chip is emitted through the phosphor layer to emit uniform white light.

For example, the horizontal width of the epitaxial semiconductor layer of the light emitting chip may be equal to the horizontal width of the phosphor layer.

The horizontal width W2 of the first phosphor layer 121d of the first light emitting chip 121 is larger than the horizontal width W1 of the first semiconductor layer 121a of the first light emitting chip 121 in the embodiment Even if light emitted from the light emitting chip partially passes through the opaque molding part 132, uniform white light emission can be achieved by emitting light through the phosphor layer.

For example, in the embodiment, the horizontal width W2 of the first phosphor layer 121d is about 10% to 40% of the horizontal width W1 of the first semiconductor layer 121a of the first light emitting chip 121, the light emitted from the light emitting chip can be emitted through the phosphor layer even though a part of the light passes through the opaque molding part 132, so that uniform white light emission can be achieved.

For example, the first phosphor layer 121d may protrude to both outer sides of the first semiconductor layer 121a of the first light emitting chip 121, that is, the first outer side and the second outer side.

The distance D of the first phosphor layer 121d protruding from the first outer surface of the first semiconductor layer 121a of the first light emitting chip 121 is larger than the distance D between the first semiconductor layer 121b of the first light emitting chip 121, may be in the range of about 5% to 20% of the horizontal width W1 of the first phosphor layer 121a, and the distance of the first phosphor layer 121d protruding to the second outer side opposite to the first outer side may be in the range of about 5% may be in a range of about 5% to 20% of the horizontal width W1 of the first semiconductor layer 121a of the first semiconductor layer 121.

For example, in the embodiment, the distance D of the first phosphor layer 121d protruding from the first outer surface of the first semiconductor layer 121a of the first light emitting chip 121 is smaller than the distance D between the first light emitting chip 121, a part of the light emitted from the first light emitting chip 121 may be emitted to the outside without passing through the phosphor layer when the horizontal width W1 of the first semiconductor layer 121a is less than 5%.

The distance D of the first phosphor layer 121d protruding from the first outer surface of the first semiconductor layer 121a of the first light emitting chip 121 is larger than the distance D between the first light emitting chip 121 and the first light emitting chip 121, if the width W1 of the semiconductor layer 121a is more than 10%, the size of the light emitting chip may be unnecessarily large.

In the flash module of the embodiment, the light emitting module 100 may include a first diffusion layer 134 on the first light emitting chip 121 and the second light emitting chip 122.

In the embodiment, the light extraction efficiency can be improved by the light diffusion by the first diffusion layer 134.

The first diffusion layer 134 may be formed by mixing SiO2 or TiO2 with the resin, but it is not limited thereto.

Also, it is an object of the present invention to provide a light emitting module, a camera module, and a terminal including the light emitting module, the camera module, and the terminal including the light emitting module excellent in reliability according to a high heat radiation effect in a flash operation of the light emitting module.

Also, it is a technical object of the present invention to provide a camera module and a terminal including the camera module in which the coupling relation between the light emitting module and the frame is robust and the mechanical reliability is improved.

The first frame 220a of the flash module according to the embodiment to solve the problem may include a first support portion 222a and a first inner protrusion portion 223a disposed on the first support portion 222a, and the second frame 220b may include a second support portion 222b and a second inner protrusion portion 223b disposed on the second support portion 222b.

At this time, the first partition 111 and the second partition 112 of the light emitting module 100 are in contact with the inner surface of the first support portion 222a and the inner surface of the second support portion 222b, since the coupling between the module 100 and the frame 220 is strengthened to improve the mechanical reliability and the heat is transferred in the direction of the frame 220 through the first partition 111 and the second partition 112, the thermal efficiency can be increased.

The first partition 111 and the second partition 112 of the light emitting module 100 are connected to the bottom surface of the first inner protruding portion 223a and the bottom surface of the second inner protruding portion 223b, the coupling efficiency between the light emitting module 100 and the frame 220 can be improved and mechanical reliability can be improved and the heat radiation efficiency can be increased through the first and second partitions 111 and 112.

The first partition 111 and the second partition 112 are adhered to the bottom surface of the first inner protruding portion 223a and the bottom surface of the second inner protruding portion 223b by a predetermined metallic or non-metallic adhesive, but it is not limited thereto.

Also, it is a technical object of the present invention to provide a camera module and a terminal including the camera module, which can implement uniform light distribution by increasing the alignment accuracy of the light emitting chip and the flash lens.

In order to solve such a problem, in the flash module of the embodiment, the first frame 220a includes a third inner protruding portion 224a disposed on the first inner protruding portion 223a and a third inner protruding portion 224b disposed on the third inner protruding portion 224a and a first outer protrusion 226a disposed on the first outer protrusion 226a.

The second frame 220b may include a fourth inner protrusion 224b disposed on the second inner protrusion 223b and a second outer protrusion 226b disposed on the fourth inner protrusion 224b can do.

At this time, the lens unit 230 is arranged to be in contact with the third inner protrusion 224a and the fourth inner protrusion 224b to increase the alignment accuracy of the light emitting chip and the flash lens, thereby implementing a uniform light distribution.

For example, according to the embodiment, the higher the agreement between the distribution of light emitted from the first light emitting chip 121 and the second light emitting chip 122 and the light diffusion pattern of the lens portion 230, a wide FOV and a uniform light distribution can be obtained.

In the embodiment, the center of each light diffusion pattern and the center of each light emitting chip in the top view of the lens unit 230 can be matched.

For example, in the embodiment, by controlling the light diffusion pattern of the lens part 230 and the alignment tolerance of the light emitting chip to be about 25 μm or less, the directivity characteristics of the light emitted from the light emitting chip and the matching of the light diffusion pattern of the lens part, and the light distribution characteristic can be improved and a uniform light distribution can be obtained in addition to the implementation of the wide angle view angle (FOV).

In an embodiment, the lens portion 230 may include a lens support portion 234 and a light diffusion portion 232.

The lens unit 230 may be made of a plastic material such as an acrylic plastic material. Examples of the lens unit 230 include polymethyl methacrylate (PMMA).

Such PMMA is advantageous in that it is superior in transparency to glass and easy to process and form.

The lens unit 230 may function as a lens such as a light extracting lens or a light diffusing lens and is a member for changing a directivity characteristic of light emitted from the light emitting chip and the index of refraction is not particularly limited, 1.4 or more and 1.7 or less can be used.

The lens part 230 of the embodiment may be formed of a transparent resin material such as polycarbonate (PC) or epoxy resin (EP), transparent glass, sapphire, EMC or Silicone, but it is not limited thereto.

For example, the lens support portion 234 may be formed of a transparent resin such as polycarbonate (PC) or epoxy resin (EP), and the light diffusion portion 232 may be formed of glass or sapphire, but it is not limited thereto.

The height of the upper surface of the lens unit 230 may be equal to or less than the height of the upper surface of the frame 220.

Accordingly, since the thickness of the flash module 200 does not increase by the lens unit 230 itself in the entire thickness of the flash module 200, a very slim flash module can be implemented.

In addition, in the embodiment, the light emitting module 100 and the lens unit 230 may be spaced by a predetermined distance D.

For example, in the embodiment, the optical gap D between the first light emitting chip 121, the second light emitting chip 122 and the lens unit 230 is precisely controlled to obtain a slim Flash modules can be implemented.

For example, in the embodiment, since the optical gap D between the first light emitting chip 121, the second light emitting chip 122 and the lens unit 230 is precisely controlled to about 0.2 to 0.5 mm, a slim flash module can be implemented with a wide angle of view.

Figure 7A:
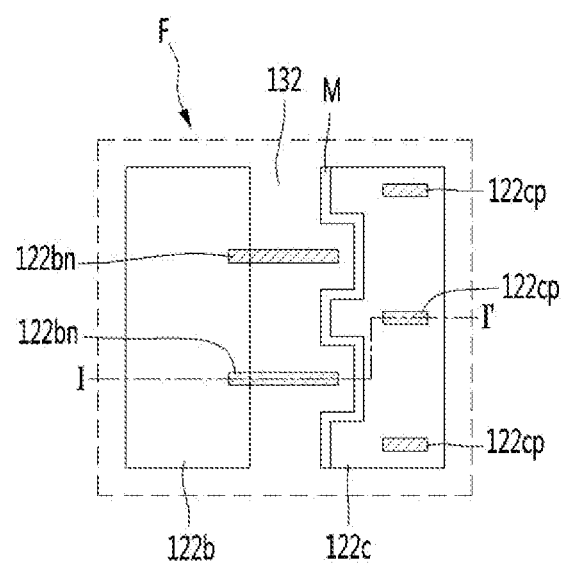
FIG. 7A is a partial enlarged view of a bottom view of the flash module according to the first embodiment.
Figure 7B:
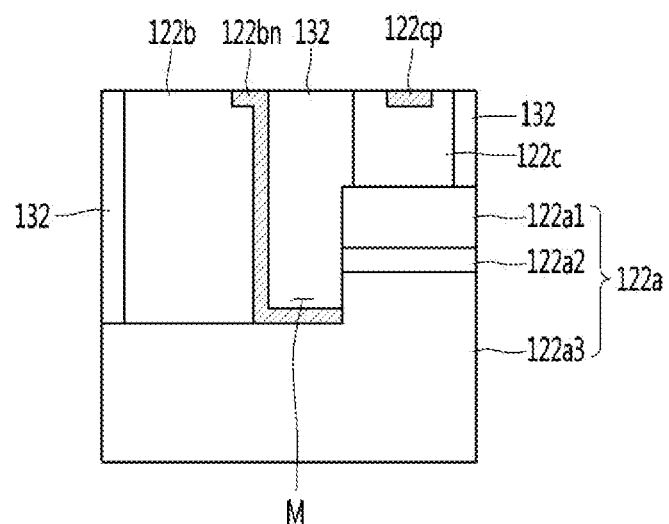
FIG. 7B is a partial cross-sectional view of the flash module according to the first embodiment.

FIG. 7A is an enlarged view of a portion (F) of a bottom view of the flash module according to the first embodiment, FIG. 7B is an enlarged view of the flash module according to the first embodiment, sectional view of the light emitting module taken along the line I-I' in FIG. 7A.

Figure 6:
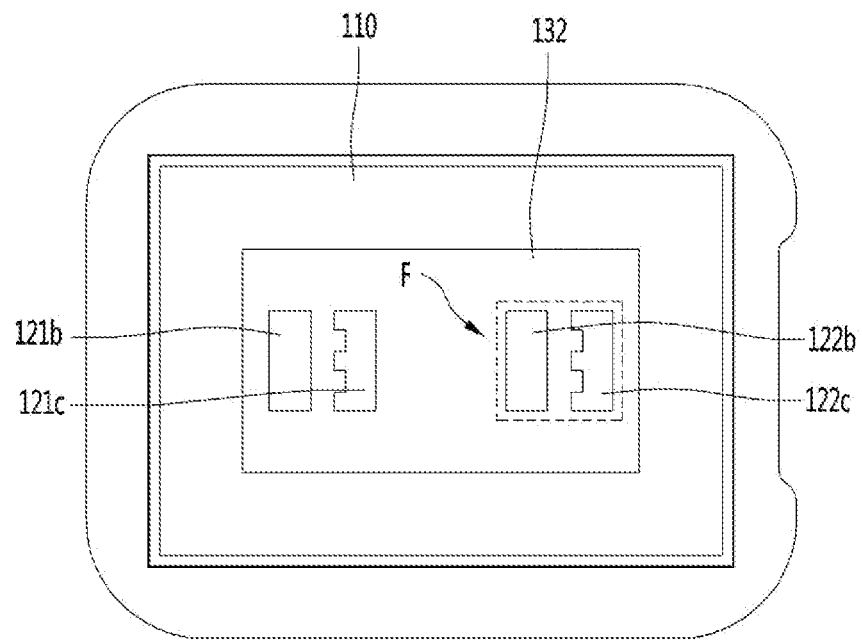
FIG. 6 is a bottom view of the flash module according to the first embodiment.

Referring to FIG. 6, in the flash module 200 of the first embodiment, a part of the first light emitting chip 121 or the second light emitting chip 122 is inserted into the opaque molding part 132.

For example, some of the bottom surfaces of the first n-type electrode 121b and the first p-type electrode 121c of the first light emitting chip 121 may be exposed to the bottom of the opaque molding part 132.

A part of the bottom surfaces of the second n-type electrode 122b and the second p-type electrode 122c of the second light emitting chip 122 may be exposed to the bottom surface of the opaque molding part 132.

Accordingly, since the light emitting module 100 can be formed without the circuit board in the light emitting module 100 itself, the thickness T1 of the light emitting module 100 can be innovatively reduced.

For example, the thickness T1 of the light emitting module 100 can be controlled to be about 0.30 mm or less.

The embodiment can control the thickness T1 of the light emitting module 100 to be extremely slim up to about 0.25 mm or less.

Accordingly, the embodiment can provide a super slim light emitting module, a camera module, and a terminal including the same while maintaining a wide-angle view angle.

FIGS. 7A and 7B, the second light emitting chip 122 of the embodiment includes the n-type pad electrode 122bn and the p-type pad electrode 122cp, it is possible to improve the carrier injection efficiency and improve the electrical and mechanical contact performance with the power terminal portion (not shown) of the terminal (not shown).

For example, as shown in FIG. 7B, the second light emitting chip 122 may include a second semiconductor layer 122a, which is a light emitting structure layer, a first conductivity type semiconductor layer 122a3, an active layer 122a2, and a second conductivity type semiconductor layer 122a1.

The first conductivity type semiconductor layer 122a3 may be an n-type semiconductor layer, and the second conductivity type semiconductor layer 122a1 may be a p-type semiconductor layer.

At this time, in the second light emitting chip 122 of the embodiment, the mesa etching region M may be formed by removing part of the second conductivity type semiconductor layer 122a1 and the active layer 122a2, and the first conductivity type semiconductor layer 122a3 may be exposed.

A portion of the upper surface of the first conductive type semiconductor layer 122a3 may be removed when the mesa etching region M is formed, but it is not limited thereto.

In the embodiment, the second n-type electrode 122b and the second p-type electrode 122c may be disposed on the second semiconductor layer 122a.

For example, the second n-type electrode 122b and the second p-type electrode 122c may be disposed on the first conductivity type semiconductor layer 122a3 and the second conductivity type semiconductor layer 122a1, respectively.

At this time, the second light emitting chip 122 of the embodiment includes the n-type pad electrode 122bn and the p-type pad electrode 122cp on the second n-type electrode 122b and the second p-type electrode 122c.

The n-type pad electrode 122bn and the p-type pad electrode 122cp may be arranged to be equal to or lower than the height of the second n-type electrode 122b and the second p-type electrode 122c, respectively.

For example, in the embodiment, since the n-type pad electrode 122bn electrically connects the second n-type electrode 122b and the n-type semiconductor layer 122a3 and the p-type pad electrode 122bn disposed on the second p-Type pad electrode 122cp, embodiment can improve the carrier injection efficiency in the second light emitting chip 122 itself and can improve the electrical and mechanical contact performance with an RF terminal unit (not shown) of a terminal.

Hereinafter, the manufacturing process of the light emitting module and the flash module according to the first embodiment will be described with reference to FIGS. 8 to 15.

One of the technical problems of the embodiment is to provide a super slim light emitting module and a camera module.

Figure 8:
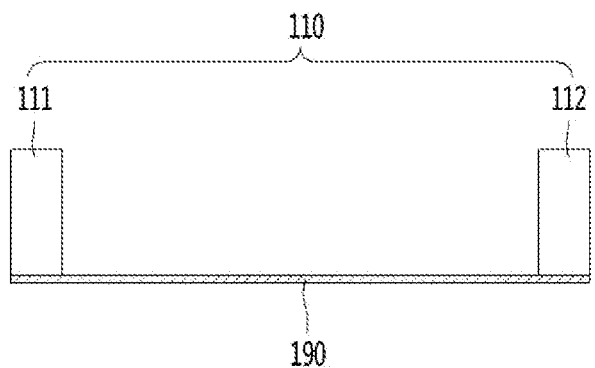
FIGS. 8 to 15 are cross-sectional views illustrating manufacturing steps of the light emitting module and the flash module according to the first embodiment.

As shown in FIG. 8, in order to form a light emitting chip without a separate circuit board, a predetermined supporting layer 190 is prepared and first and second partitions 111 and 112 spaced apart from each other are arranged.

The support layer 190 may be a foam tape, but it is not limited thereto, and may be removed after completing the light emitting module.

The foam tape may be an adhesive to which a polyester film is adhered, but it is not limited thereto.

The first partitions 111 and the second partitions 112 may be formed of a metal material.

For example, the first partition 111 and the second partition 112 may be formed of copper (Cu), aluminum (Al), or the like, but it is not limited thereto.

Also, the first partitions 111 and the second partitions 112 may be formed of a non-metallic material such as polyimide.

Figure 9:
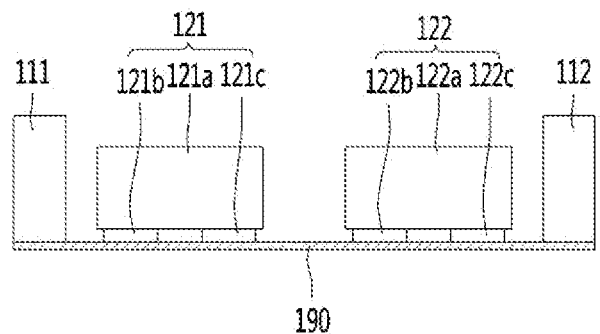

The first light emitting chip 121 and the second light emitting chip 122 may be spaced apart from each other between the first partition 111 and the second partition 112 as shown in FIG. 9.

The first light emitting chip 121 and the second light emitting chip 122 may be flip-type light emitting chips, but it is not limited thereto.

For example, the first light emitting chip 121 may include a first n-type electrode 121b and a first p-type electrode 121c disposed on a first semiconductor layer 121a functioning as a light emitting structure layer.

The second light emitting chip 122 may include a second n-type electrode 122b and a second p-type electrode 122c disposed on a second semiconductor layer 122a functioning as a light emitting structure layer.

The first semiconductor layer 121a and the second semiconductor layer 122a may be formed of a compound semiconductor such as a semiconductor compound, for example, a Group III-V, a Group II-VI, or the like.

The first semiconductor layer 121a and the second semiconductor layer 122a may be a light emitting structure layer including a first conductivity type semiconductor layer, an active layer, and a second conductivity type semiconductor layer, but it is not limited thereto.

For example, when the first conductivity type semiconductor layer is an n-type semiconductor layer, the n-type dopant group may be doped. When the second conductivity type semiconductor layer is a p-type semiconductor layer, a p--type dopant group may be doped.

At this time, the bottom surfaces of the first n-type electrode 121b and the first p-type electrode 121c are disposed in contact with the supporting layer 190, and when the supporting layer 190 is removed in the subsequent process, a part of the bottom surfaces of the electrode 121b and the first p-type electrode 121c may be exposed to the bottom surface of the opaque molding part 132.

The bottom of each of the second n-type electrode 122b and the second p-type electrode 122c is disposed so as to be in contact with the supporting layer 190. When the supporting layer 190 is removed in the subsequent process, Part of the bottom surfaces of the electrode 122b and the second p-type electrode 122c may be exposed to the bottom surface of the opaque molding part 132.

Accordingly, in the embodiment, since the light emitting module 100 can be formed without a circuit board in the light emitting module 100 itself, the thickness T1 of the light emitting module can be innovatively reduced.

For example, the thickness T1 of the light emitting module 100 can be controlled to be about 0.30 mm or less.

The embodiment can control the thickness T1 of the light emitting module 100 to be extremely slim up to about 0.25 mm or less.

Accordingly, the embodiment can provide a very slim light emitting module, a camera module, and a terminal including the same, while maintaining a wide-angle view angle.

Figure 10:
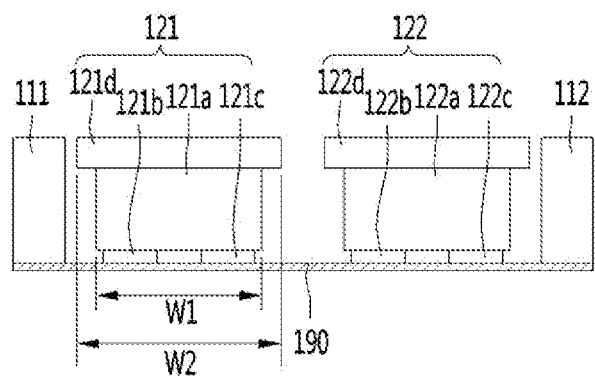

Next, as shown in FIG. 10, a first phosphor layer 121d and a second phosphor layer 122d disposed on the upper surface of the second semiconductor layer 122a may be formed on the first semiconductor layer 121a.

In the embodiment, the first phosphor 121d or the second phosphor 122d may be a yellow phosphor, but it is not limited thereto.

For example, the yellow phosphor may be, but not limited to, YAG.

In addition, in the embodiment, the first phosphor 121d or the second phosphor 122d may be a composite phosphor of a red phosphor and a green phosphor.

For example, the red phosphor may include, but it is not limited to, a compound-based phosphor such as (Ca, sr) S: Eu2+ or a nitride-based phosphor such as CaAlSiN3:Eu2+ phosphor.

The green phosphor may include at least of (Y,Gd,Lu,Tb)3(Al,Ga)5O12:Ce, (Mg,Ca,Sr,Ba)2SiO4:Eu, (Ca,Sr)3SiO5:Eu, (La,Ca)3Si6N11:Ce, α-SiAlON:Eu, β-SiAlON:Eu, but it is not limited thereto.

Embodiments of the present invention provide an integrated light emitting module, a camera module, and a terminal including the same in consideration of emotional illumination in a camera flash technology field.

In an embodiment, the color temperature (CCT) of the first light emitting chip 121 and the color temperature of the second light emitting chip 122 may be different from each other.

For example, the first light emitting chip 121 may emit a warm-white light and the second light emitting chip 122 may emit a cool-white light.

For example, the first light emitting chip 121 may emit a warm-white light of about 3,000 K, and the second light emitting chip 122 may emit a cool-white light of about 5,000 K cool-white.

For example, when the first light emitting chip 121 of the embodiment is a blue light emitting chip, the relative proportion of the blue light can be lowered by increasing the proportion of the phosphor in the first phosphor 121d to implement warm-white.

When the second light emitting chip 122 of the embodiment is a blue light emitting chip, the relative proportion of the blue light may be increased by lowering the ratio of the phosphor in the second phosphor 122d to achieve cool-white, but it is not limited thereto.

Embodiments can provide an integrated light emitting module, a camera module, and a terminal including the same, which can emit light through warm-white and cool-white light emission in a camera flash technology area.

In the embodiment, the horizontal width of the phosphor layer is larger than the horizontal width of the epi-semiconductor layer of the light emitting chip, so that the light emitted from the light emitting chip is emitted through the phosphor layer, thereby achieving uniform white light emission.

For example, in the embodiment, since the horizontal width W1 of the first semiconductor layer 121a of the first light emitting chip 121 is larger than the horizontal width W2 of the first phosphor layer 121d of the first light emitting chip 121, the light emitted from the light emitting chip may be emitted through the phosphor layer even though the light partially passes through the opaque molding part 132, thereby making it possible to emit uniform white light.

Figure 11:
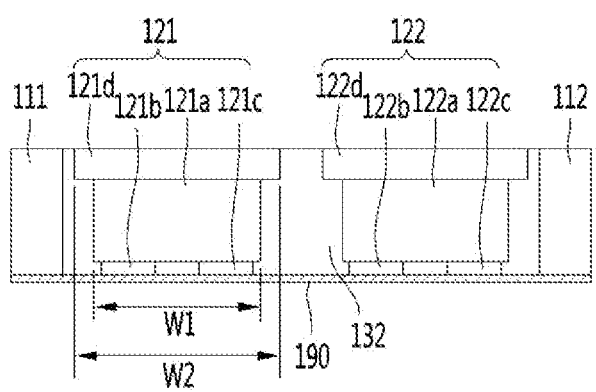

FIG. 11, an opaque molding part 132 can be injected between the first light emitting chip 121 and the second light emitting chip 122 disposed between the first partition 111 and the second partition 112.

The opaque molding part 132 may include a white mold, but it is not limited thereto.

For example, the opaque molding part 132 may be a white mold composition in which an oxide such as $TiO_2$ is dispersed in silicone, but it is not limited thereto.

Accordingly, in the embodiment, the opaque molding part 132 can prevent mixing of light emitted from the first light emitting chip 121 and the second light emitting chip 122, so that a uniform white color can be implemented.

Figure 12:
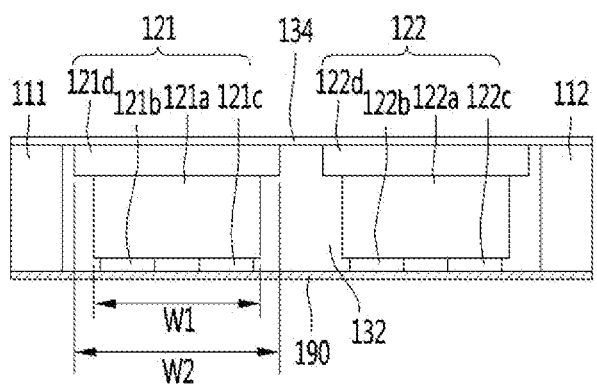

Next, as shown in FIG. 12, a first diffusion layer 134 may be formed on the first light emitting chip 121 and the second light emitting chip 122.

In the embodiment, the light extraction efficiency can be improved by the light diffusion by the first diffusion layer 134.

The first diffusion layer 134 may be formed by mixing $SiO_2$ or $TiO_2$ with the resin, but it is not limited thereto.

Figure 13:
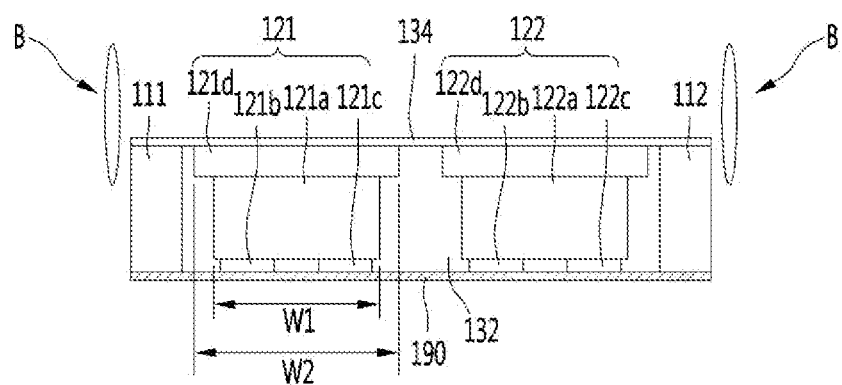

Next, as shown in FIG. 13, the light emitting modules can be separated for each cell using a predetermined blade (B).

Figure 14:
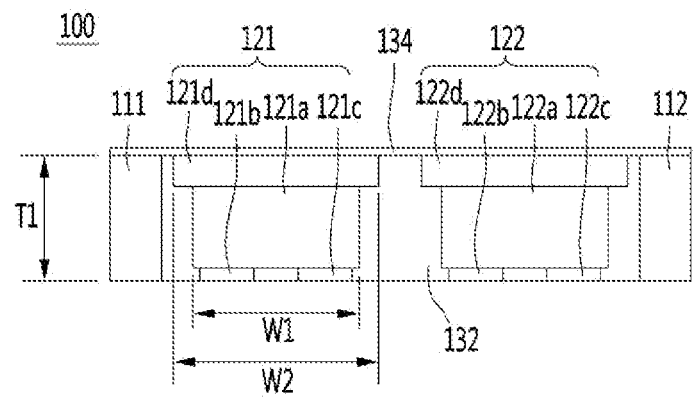

Next, as shown in FIG. 14, the supporting layer 190 is removed to manufacture the light emitting module 100 according to the embodiment.

Figure 15:
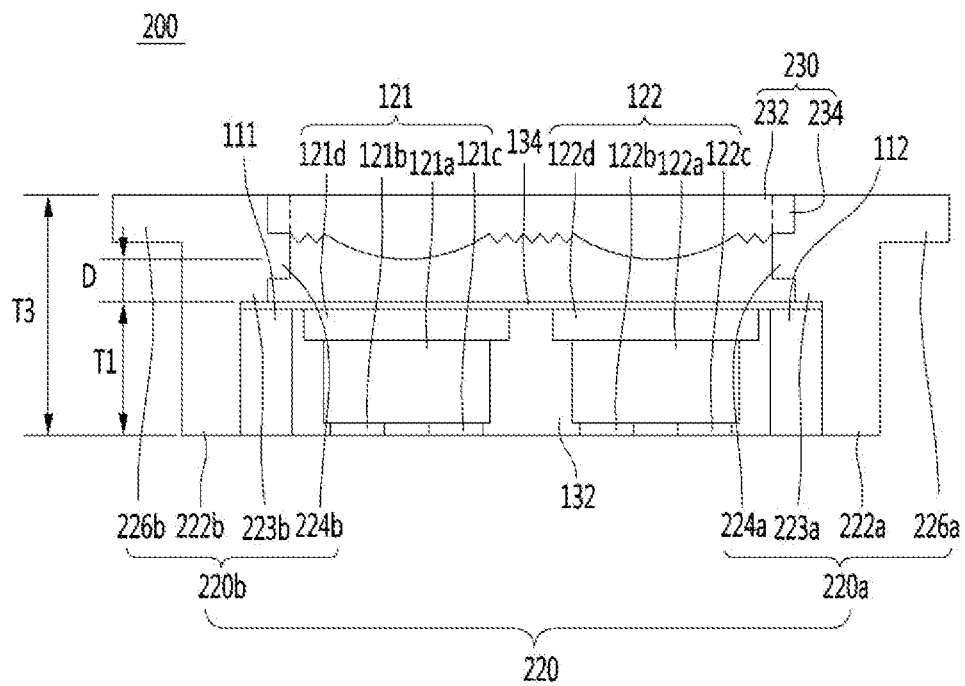

Next, as shown in FIG. 15, the light emitting module 100 may be disposed between the first frame 220a and the second frame 220b.

A predetermined adhesive material may be formed between the first partition 111 and the first frame 220a of the light emitting module 100 and between the second partition 112 and the second frame 220b.

For example, white silicon may be applied between the first partition 111 and the first frame 220a of the light emitting module 100 and between the second partition 112 and the second frame 220b, but it is not limited thereto.

Accordingly, since the light emitting module 100 is disposed inside the frame, the thickness of the light emitting module 100 itself may not cause the thickness of the entire flash module 200 to increase.

The thickness of the flash module 200 according to the embodiment can be made to be the thickness T3 of the frame 220 so that the thickness T of the flash module can be slimly reduced.

For example, the thickness T of the flash module can be reduced to about 0.85 mm or less.

In addition, the thickness T of the flash module can be reduced to about 0.65 mm or less.

Of course, if the thickness of the frame 220 itself is reduced, the thickness of the flash module can be further reduced.

It is an object of the present invention to provide a light emitting module, a camera module, and a terminal including the same excellent in reliability according to a high heat radiation effect.

Also, it is a technical object of the present invention to provide a camera module and a terminal including the camera module in which the coupling relation between the light emitting module and the frame is robust and the mechanical reliability is improved.

The first frame 220a of the flash module according to the embodiment may include a first support portion 222a and a first inner protrusion portion 223a disposed on the first support portion 222a, and the second frame 220b may include a second support portion 222b and a second inner protrusion portion 223b disposed on the second support portion 222b.

At this time, the first partition 111 and the second partition 112 of the light emitting module 100 are in contact with the inner surface of the first support portion 222a and the inner surface of the second support portion 222b, since the coupling between the module 100 and the frame 220 is strengthened to improve the mechanical reliability, so that the heat is transferred in the direction of the frame 220 through the first partition 111 and the second partition 112, the thermal efficiency can be increased.

The first partition 111 and the second partition 112 of the light emitting module 100 may be formed on the bottom surface of the first inner protruding portion 223a and the bottom surface of the second inner protruding portion 223b, the coupling efficiency between the light emitting module 100 and the frame 220 can be improved and mechanical reliability can be improved and the heat radiation efficiency can be increased through the first and second partitions 111 and 112.

The first partition 111 and the second partition 112 are adhered to the bottom surface of the first inner protruding portion 223a and the bottom surface of the second inner protruding portion 223b by a predetermined metallic or non-metallic material, but it is not limited thereto.

Also, it is a technical object of the present invention to provide a camera module and a terminal including the camera module, which can implement uniform light distribution by increasing the alignment accuracy of the light emitting chip and the flash lens.

In order to solve such a problem, in the flash module of the embodiment, the first frame 220a includes a third inner protruding portion 224a disposed on the first inner protruding portion 223a and a third inner protruding portion 224b disposed on the third inner protruding portion 224a and a first outer protrusion 226a disposed on the first outer protrusion 226a.

The second frame 220b includes a fourth inner protrusion 224b disposed on the second inner protrusion 223b and a second outer protrusion 226b disposed on the fourth inner protrusion 224b.

At this time, the lens unit 230 is arranged to be in contact with the third inner protrusion 224a and the fourth inner protrusion 224b to increase the alignment accuracy of the light emitting chip and the flash lens, thereby implementing a uniform light distribution.

For example, according to the embodiment, the higher the agreement between the distribution of light emitted from the first light emitting chip 121 and the second light emitting chip 122 and the light diffusion pattern of the lens portion 230, a wide angle FOV and a uniform light distribution can be obtained.

In the embodiment, the center of each light diffusion pattern and the center of each light emitting chip in the top view of the lens unit 230 can be matched.

For example, in the embodiment, by controlling the light diffusion pattern of the lens part 230 and the alignment tolerance of the light emitting chip to be about 25 μm or less, the directivity characteristics of the light emitted from the light emitting chip and the matching of the light diffusion pattern of the lens part, and the light distribution characteristic can be improved and a uniform light distribution can be obtained in addition to the implementation of the wide angle view angle (FOV).

In an embodiment, the lens portion 230 may include a lens support portion 234 and a light diffusion portion 232.

The lens unit 230 may be made of a plastic material such as an acrylic plastic material. Examples of the lens unit 230 include polymethyl methacrylate (PMMA).

Such PMMA is advantageous in that it is superior in transparency to glass and easy to process and form.

The lens unit 230 may function as a lens such as a light extracting lens or a light diffusing lens and is a member for changing a directivity characteristic of light emitted from the light emitting chip and the index of refraction is not particularly limited, 1.4 or more and 1.7 or less can be used.

The lens part 230 of the embodiment may be formed of a transparent resin material such as polycarbonate (PC) or epoxy resin (EP), transparent glass, sapphire, EMC or Silicone, but it is not limited thereto.

For example, the lens support portion 234 may be formed of a transparent resin such as polycarbonate (PC) or epoxy resin (EP), and the light diffusion portion 232 may be formed of glass or sapphire.

The height of the upper surface of the lens unit 230 may be equal to or less than the height of the upper surface of the frame 220.

Accordingly, since the thickness of the flash module 200 does not increase by the lens unit 230 itself in the entire thickness of the flash module 200, a very slim flash module can be implemented.

In addition, in the embodiment, the light emitting module 100 and the lens unit 230 may be separated by a predetermined distance D.

For example, in the embodiment, the optical gap D between the first light emitting chip 121 and the second light emitting chip 122 and the lens unit 230 is precisely controlled and a slim Flash modules can be implemented.

For example, in the embodiment, the optical gap D between the first light emitting chip 121 and the second light emitting chip 122 and the lens unit 230 is precisely controlled to about 0.2 to 0.5 mm so that a slim flash module can be implemented with a wide angle of view.

Second Embodiment

Figure 16:
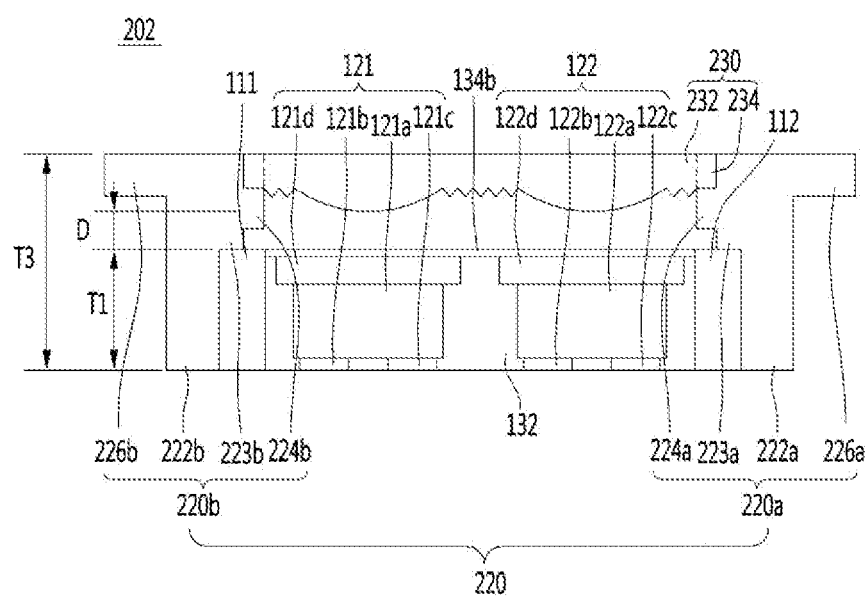
FIG. 16 is a sectional view of the flash module according to the second embodiment.

FIG. 16 is a cross-sectional view 202 of a flash module according to the second embodiment, which can employ the technical features of the first embodiment described above, and will be described below focusing on the main technical features of the second embodiment.

The second diffusion layer 134b in the flash module of the second embodiment shown in FIG. 16 is disposed on the upper surface of the first light emitting chip 121 and the second light emitting chip 122, and the second diffusion layer 134b is not disposed on the first partition 111, the second partition 112, so that the adhevesity between the first partition 111, the second partition 112 and the first inner protruding portion 223a, the second inner protruding portion 223b can be improved.

According to the embodiments described above, it is possible to provide a super slim light emitting module, a camera module, and a terminal including the same, while maintaining a wide angle.

In addition, embodiments can provide a warm-white and cool-white integrated light emitting module, a camera module, and a terminal including the same capable of emotional lighting in the camera flash technology area.

In addition, the embodiment can provide a light emitting module, a camera module, and a terminal including the light emitting module excellent in reliability according to a high heat radiation effect in a flash operation of the light emitting module.

Also, the embodiment can provide a light emitting module, a camera module, and a terminal including the same, which can implement a uniform light distribution with high alignment accuracy between the light emitting chip and the flash lens.

In addition, the embodiment can provide a light emitting module, a camera module, and a terminal including the same, wherein the coupling relation between the light emitting module and the frame is strong and the mechanical reliability is improved.

Third Embodiment

Figure 17:
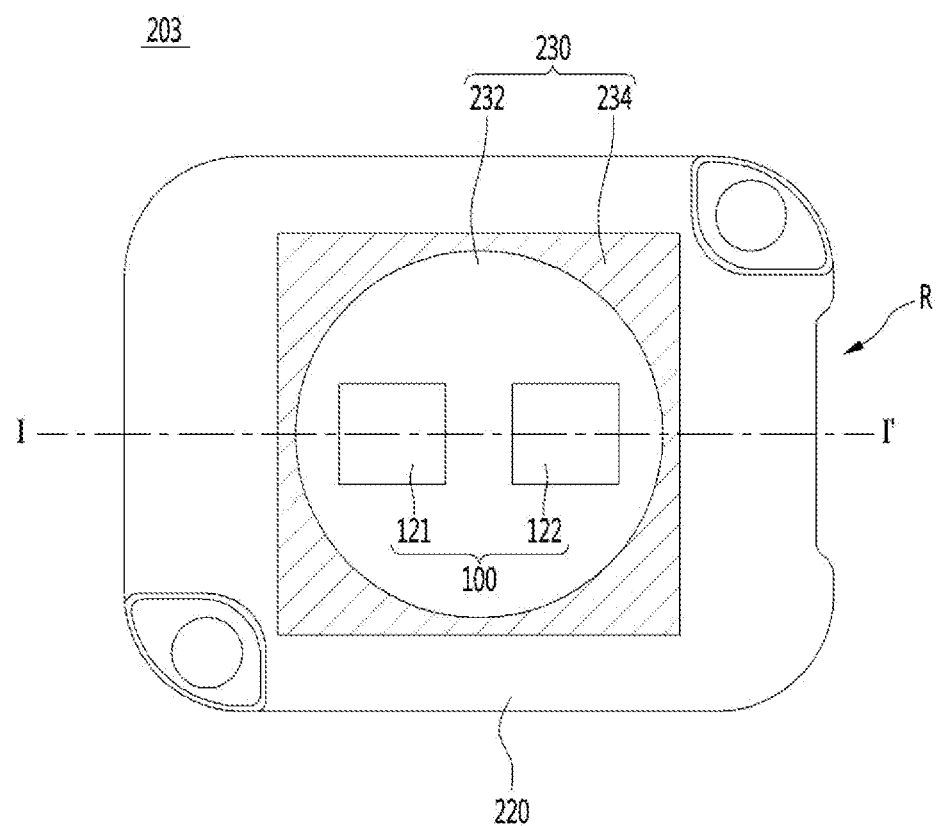
FIG. 17 is a plan view of the flash module according to the third embodiment.

FIG. 17 is a plan view of the flash module 203 according to the third embodiment.

Referring to FIG. 17, the light emitting module 100 of the third embodiment may include the first light emitting chip 121 and the second light emitting chip 122, and the frame 220 of the embodiment may include the light emitting module 100, and may include a predetermined recess R on the outside of the linear direction I-I' passing through the first light emitting chip 121 and the second light emitting chip 122.

The lens portion 230 includes a light diffusion portion 232 in which a predetermined pattern (see P1 and P2 in FIG. 19A) is disposed and a lens support portion 234 disposed in contact with the outside of the light diffusion portion 232.

The third embodiment can adopt the technical features of the first and second embodiments.

For example, in the third embodiment, by including the recess R on the outside of the linear direction I-I' passing through the first light emitting chip 121 and the second light emitting chip 122, it is possible to identify the first light emitting chip 121 or the second light emitting chip 122 and to easily mount each light emitting chip in a camera module having a warm-white and a cool-white LED chips, it is possible to easily control the operation of each light emitting chip when the camera module is used later, and it is also possible to easily diagnose the failure.

Figure 18:
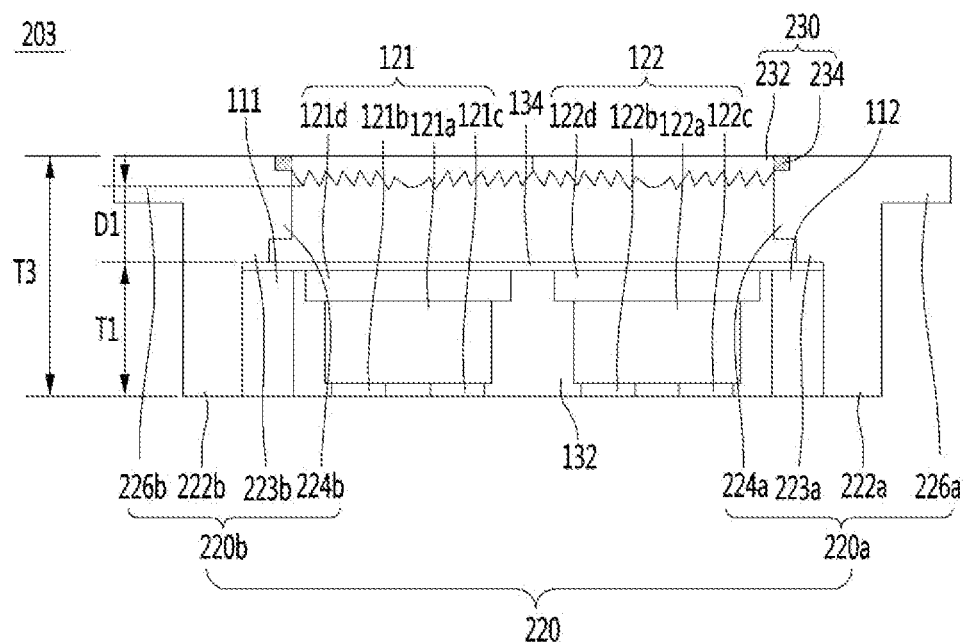
FIG. 18 is a sectional view of the flash module according to the third embodiment.
Figure 19A:
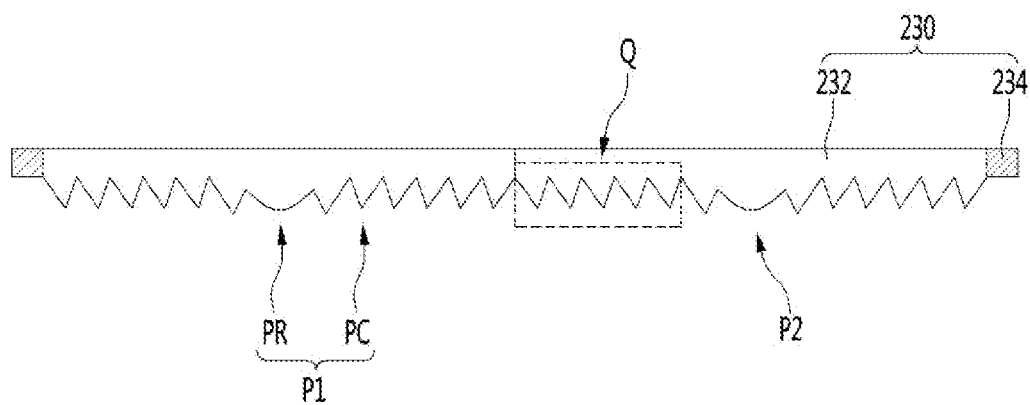
FIG. 19A is an enlarged cross-sectional view of the lens portion in the flash module according to the third embodiment.
Figure 19B:
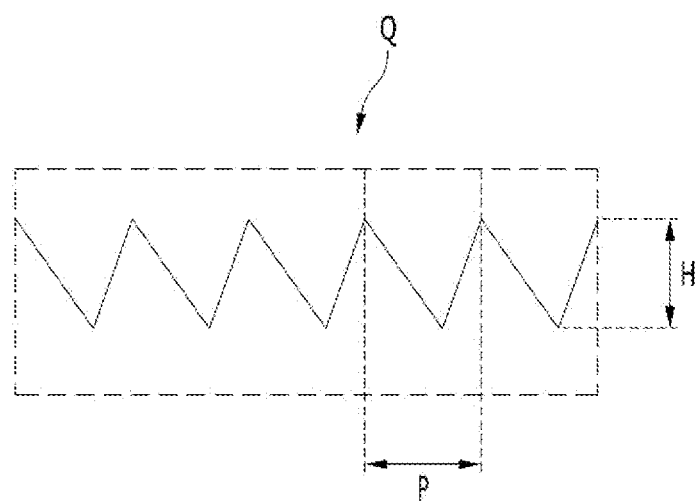
FIG. 19B is a partial enlarged view of the lens portion in the flash module according to the third embodiment.

FIG. 18 is a cross-sectional view taken along line I-I' of FIG. 17 in the flash module 203 according to the third embodiment. FIG. 19A is an enlarged cross-sectional view of the lens portion 230 in the flash module according to the third embodiment and FIG. 19B is an enlarged view of a portion (Q) of the lens portion 230 in the flash module according to the third embodiment.

Referring to FIG. 18, the flash module 200 of the third embodiment includes a light emitting module 100 including a first light emitting chip 121, a second light emitting chip 122, a frame 220 and a lens unit 230.

The first light emitting chip 121 and the second light emitting chip 122 of the embodiment may be flip-type light emitting chips, but the embodiment is not limited thereto.

One of the technical problems of the embodiments is to provide a super slim light emitting module, a flash module, a camera module and a terminal including the same, while maintaining a wide angle.

Further, one of the technical problems of the embodiment is to provide a terminal in which the end portion of the pattern of the lens is a sharp flash module, a camera flash, and a terminal including the same.

Also, one of the technical problems of the embodiments is to provide a flash module, a camera flash, and a terminal including the flash module with a lens portion having high scratch resistance.

Referring to FIGS. 19A and 19B, features of the technical solution for the flash module according to the third embodiment for solving the above three technical problems will be described in detail.

The features of each configuration shown in FIG. 18 can adopt the technical features of the first and second embodiments.

Referring to FIG. 19A, the lens unit 230 mounted on the flash module 203 according to the third embodiment includes a plurality of light diffusion patterns P1 and P2, 2 light diffusion of the light emitted from the light emitting chip 122 can be increased to implement a wide angle of view (FOV).

For example, when two light emitting chips such as the first light emitting chip 121 and the second light emitting chip 122 are provided in the light emitting module, the first light diffusion pattern P1, the second light diffusion pattern P2, but it is not limited thereto.

When there are four light emitting chips, four light diffusion patterns may be provided.

The first light diffusion pattern P1 may include a curvature pattern PR and a concavo-convex pattern PC, but it is not limited thereto.

The second light diffusion pattern P2 may also include a curvature pattern PR and a concavo-convex pattern PC.

According to the current technology of wide angle camera, the angle of view (FOV) of the flash module required in the industry is in a situation in which a wide angle of about 120° or more is required continuously as a dual camera is continuously developed. Further, attributes of uniform light distribution at a wide angel must also be implemented at the same time.

According to the embodiment, the angle of view (FOV) of the camera flash can be implemented up to 120°, and it can be implemented up to 135°.

According to the embodiment, as the degree of coincidence between the distribution of light emitted from the first light emitting chip 121 and the second light emitting chip 122, and the degree of coincidence of the light diffusion pattern of the lens portion 230 is higher, and a uniform light distribution can be obtained at the same time.

For example, in the embodiment, the centers of the light diffusion patterns P1 and P2 and the centers of the light emitting chips 121 and 122 in the top view of the lens unit 230 can be matched.

For example, in the embodiment, the alignment tolerance of the light diffusion patterns P1 and P2 of the lens portion 230 and the light emitting chips 121 and 122 is controlled to be about 25 μm or less, and the light diffusion pattern of the lens unit is remarkably improved, it is possible to obtain a uniform light distribution by improving the light distribution characteristic as well as implementing the wide angle view angle (FOV).

For example, the embodiment can reduce the alignment tolerance of the light emitting chips 121 and 122 to approximately 25 μm or less from the center of the curvature pattern PR of the first and second light diffusion patterns P1 and P2 of the light diffusion portion 232, the uniformity of light distribution can be obtained in addition to the implementation of the wide angle viewing angle (FOV) as the directivity characteristics of the light emitted from the light emitting chip and the correspondence of the light diffusion pattern of the lens portion are remarkably improved.

In the camera flash according to the third embodiment, the lens unit 230 includes a light diffusion unit 232 having predetermined light diffusion patterns P1 and P2 disposed thereon, and a lens support unit 234.

Referring to FIG. 19A, in the third embodiment, the first light diffusion pattern P1 may include a curvature pattern PR and a concavo-convex pattern PC, and the second light diffusion pattern P2 may also include a curvature pattern PR and a concavo-convex pattern PC.

In an embodiment, the curvature or radius of the curvature pattern PR may be about 0.3 mm or less.

For example, the curvature or radius of the curvature pattern PR may be about 0.0001 mm to 0.3 mm.

When the curvature or radius of the curvature pattern PR exceeds 0.3 mm, there is a problem that the light converging property may be bad, the light distribution may become rough, or the appearance may appear rough.

The curvature or radius of the curvature pattern PR is controlled to be about 0.3 mm or less so that screening can be performed so that the light emitting chip or the like inside the frame 220 of the camera flash cannot be seen, and in light of Design it is possible to have a technical effect capable of implementing emotional characteristics.

The thickness T2 of the lens portion 231 can be controlled to be super slim of about 0.1 mm to 0.2 mm so that the curvature or radius of the curvature pattern PR can be reduced and can be controlled to about 0.2 mm or less.

For example, the curvature or radius of the curvature pattern PR may be controlled to be about 0.0001 mm to 0.2 mm, thereby implementing uniform light distribution and excellent light converging characteristics.

The height of the curvature pattern PR of the first and second light diffusion patterns P1 and P2 may be about 0.3 mm or less.

For example, the height of the curvature pattern PR may be about 0.0001 mm to 0.3 mm.

If the height of the curvature pattern PR exceeds 0.3 mm, the light converging characteristic may be bad.

In the embodiment, when the height of the curvature pattern PR is controlled to be about 0.3 mm or less, for example, 0.2 mm or less, excellent light collection characteristics and uniform light distribution can be implemented.

In an embodiment, the light diffusion portion 232 may include a glass material, and the support portion 234 may be a plastic material.

For example, the light diffusion part 232 may be formed of sapphire, and the support part 234 may be made of an acrylic plastic material. Examples of the support part 234 include, but are not limited to, PMMA (polymethyl methacrylate).

Referring to FIG. 19B, the height H of the concavo-convex pattern PC in the light diffusion patterns P1 and P2 in the lens portion 230 of the embodiment may be about 0.1 mm to 0.2 mm.

The height H of the concavo-convex pattern PC can be precisely controlled to about 0.1 mm to 0.2 mm by etching or the like when the light diffusion portion 232 is made of glass material, for example, sapphire.

Thus, the embodiment can remarkably reduce the thickness T2 of the lens portion, thereby providing a super slim flash module.

On the other hand, in the related art, when the thickness of the lens portion is formed to about 0.2 mm, distortion of the lens pattern shape occurs in the cooling process, and therefore, there is a problem that the lens portion cannot be formed at 0.2 mm or less.

On the other hand, according to the embodiment, it is possible to provide a flash module, a camera module, and a terminal including the same, which is provided with a super slim lens unit having a thickness of about 0.1 mm to 0.2 mm while maintaining a wide angle.

Also referring to FIG. 19B, in the embodiment, the pitch P of the concavo-convex pattern PC in the light diffusion patterns P1 and P2 of the lens part 230 can be precisely controlled to about 0.1 mm to 0.2 mm, the end portion of the pattern is formed to be very sharp so that the round shape is not generated.

Accordingly, according to the embodiment, since the concave and convex pattern PC having a sharp end with a very fine pitch is provided, it is possible to screen the light emitting chip or the like inside the frame 220 of the camera flash, it is possible to have a technical effect capable of implementing emotional characteristics.

Referring to FIG. 19A, embodiments can provide a flash module having a lens portion having the high resistance, a camera module, and a terminal including the same. Since the lens portion is formed of a glass material, it has a high resistance against scratches that may occur during a process or use due to the outer surface of a light diffusion portion 232 exposed to the outside.

Referring again to FIG. 18, a technical solution for implementing a slim light emitting module and a flash module will be described in more detail.

In the related art, the thickness of the flash module including the lens portion is about 2.5 mm or more, and it is difficult to reduce the thickness.

This is because, in the related art, after the SMT operation of the light emitting module on the package substrate, the lens is separately attached to the camera cover case, thereby limiting the thickness of the camera flash module.

In addition, according to the applicant's recent unpublished internal technology, the lens portion is formed as an injection molding structure in the frame, thus, even if the thickness of the camera flash module is made as thin as possible, about 1.4 mm is the limit of the internal technology.

The flash module 200 according to the embodiment of the present invention can have super slim thickness T of the flash module to a thickness of about 1 mm or less beyond the technical limit.

The thickness T1 of the light emitting module is reduced in the flash module 200 and the light emitting module 100 is disposed inside the frame 220 and the slim lens portion 230 is be disposed upper inside the frame 220.

That is, the thickness of the flash module 200 according to the embodiment may be the thickness T3 of the frame, and the thickness T of the flash module may be slimly reduced.

For example, the thickness (T) of the flash module can be reduced to about 0.85 mm or less.

In addition, the embodiment can achieve ultra-slimming even when the thickness T of the flash module is about 0.65 mm or less.

This can be achieved by making the thickness T2 of the above-described lens unit ultra slim.

The thickness T2 of the lens portion 230 can be controlled to be about ⅓ or less of the thickness T3 of the frame 220 in the embodiment.

For example, the thickness T2 of the lens portion 230 can be controlled to be about 0.20 mm or less.

The thickness T2 of the lens unit 230 can be controlled to about 0.10 mm or less.

In addition, the thickness T1 of the light emitting module 100 may be controlled to be about ⅓ or less of the thickness of the frame 220 in the embodiment.

Particularly, in the embodiment, since the light emitting module 100 can be formed without a circuit board in the light emitting module 100 itself, the thickness T1 of the light emitting module can be innovatively reduced.

For example, the thickness T1 of the light emitting module 100 can be controlled to be about 0.30 mm or less.

The embodiment can control the thickness T1 of the light emitting module 100 to be ultra slim to about 0.25 mm or less.

Accordingly, embodiments can provide a super slim light emitting module, a camera module, and a terminal including the same, while maintaining a wide angle of view.

In addition, in the embodiment, the light emitting module 100 and the lens unit 230 may be spaced apart by a predetermined distance D1.

For example, in the embodiment, the optical gap D1 between the first light emitting chip 121, the second light emitting chip 122, and the lens unit 230 is precisely controlled to provide a slim Flash module.

For example, in the embodiment, the optical gap D1 between the first light emitting chip 121 and the second light emitting chip 122 and the lens unit 230 is precisely controlled to about 0.2 to 0.5 mm with a wide angle of view.

The height of the upper surface of the lens unit 230 may be equal to or less than the height of the upper surface of the frame 220.

Accordingly, since the thickness of the flash module 200 does not increase by the lens unit 230 itself in the entire thickness of the flash module 200, a very slim flash module can be implemented.

Figure 20:
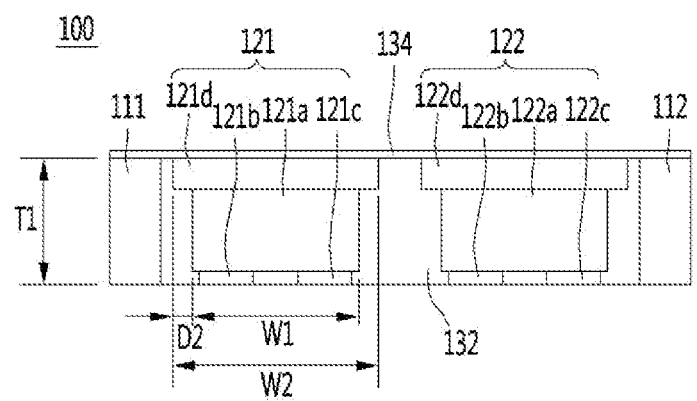
FIG. 20 is a sectional view of a light emitting module in a flash module according to a third embodiment.

FIG. 20 is a sectional view of a light emitting module in a flash module according to the third embodiment.

In the third embodiment, since the horizontal width of the phosphor layer is larger than the horizontal width of the epi-semiconductor layer of the light emitting chip, light emitted from the light emitting chip can be emitted through the phosphor layer to emit uniform white light, but it is not limited to.

For example, the horizontal width of the epitaxial semiconductor layer of the light emitting chip may be equal to the horizontal width of the phosphor layer.

The horizontal width W2 of the first phosphor layer 121d of the first light emitting chip 121 is larger than the horizontal width W1 of the first semiconductor layer 121a of the first light emitting chip 121 in the embodiment, even if light emitted from the light emitting chip partially passes through the opaque molding part 132, uniform white light emission can be achieved by emitting light through the phosphor layer.

For example, in the embodiment, the horizontal width W2 of the first phosphor layer 121d is about 10% to 40% of the horizontal width W1 of the first semiconductor layer 121a of the first light emitting chip 121, the light emitted from the light emitting chip can be emitted through the phosphor layer even though a part of the light passes through the opaque molding part 132, so that uniform white light emission can be achieved.

For example, the first phosphor layer 121d may protrude to both outer sides of the first semiconductor layer 121a of the first light emitting chip 121, that is, the first outer side and the second outer side.

The distance D2 of the first phosphor layer 121d protruding from the first outer surface of the first semiconductor layer 121a of the first light emitting chip 121 is larger than the distance D2 between the first semiconductor layer 121b of the first light emitting chip 121 and the first light emitting chip 121, may be in the range of about 5% to 20% of the horizontal width W1 of the first phosphor layer 121a. The distance of the first phosphor layer 121d protruding to the second outer side opposite to the first outer side may be in a range of about 5% to 20% of the horizontal width W1 of the first semiconductor layer 121a of the first semiconductor layer 121.

The distance D2 between the first phosphor layer 121d protruding from the first outer surface of the first semiconductor layer 121a of the first light emitting chip 121 is greater than the distance D2 between the first light emitting chip 121 and the first light emitting chip 121, a part of the light emitted from the first light emitting chip 121 may be emitted to the outside without passing through the phosphor layer when the horizontal width W1 of the first semiconductor layer 121a is less than 5%.

The distance D2 of the first phosphor layer 121d protruding from the first outer surface of the first semiconductor layer 121a of the first light emitting chip 121 is larger than the distance D2 between the first light emitting chip 121 and the first light emitting chip 121, if the width WI of the semiconductor layer 121a is more than 10%, the size of the light emitting chip may be unnecessarily large.

Fourth Embodiment

Figure 21:
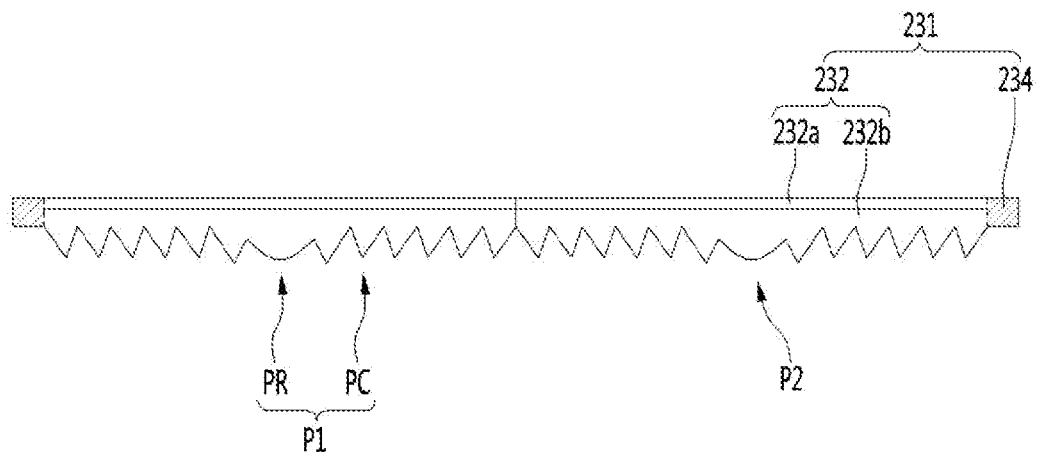
FIG. 21 is an enlarged sectional view of the second lens portion in the flash module according to the fourth embodiment.

Next, FIG. 21 is an enlarged sectional view of the second lens portion 231 in the flash module according to the fourth embodiment.

Referring to FIG. 21, the second light diffusion portion 232 of the second lens portion 231 includes a pattern portion 232b in which light diffusion patterns P1 and P2 are disposed, and a light output unit 232a through which light emitted from the light emitting unit 122 is emitted.

The first light diffusion pattern P1 may include a curvature pattern PR and a concavo-convex pattern PC, but it is not limited thereto.

The second light diffusion pattern P2 may also include a curvature pattern PR and a concavo-convex pattern PC.

At this time, the curvature or radius of the curvature pattern PR may be about 0.3 mm or less.

For example, the curvature or radius of the curvature pattern PR may be about 0.0001 mm to 0.3 mm.

When the curvature or radius of the curvature pattern PR exceeds 0.3 mm, there is a problem that the light converging property may be bad, the light distribution may become rough, or the appearance may appear rough.

The curvature or radius of the curvature pattern PR is controlled to be about 0.3 mm or less so that screening can be performed so that the light emitting chip or the like inside the frame 220 of the camera flash cannot be seen, and in light of Design it is possible to have a technical effect capable of implementing emotional characteristics.

The thickness T2 of the lens portion 231 can be controlled to be super slim of about 0.1 mm to 0.2 mm so that the curvature or radius of the curvature pattern PR can be reduced to and to be controlled about 0.2 mm or less.

For example, the curvature or radius of the curvature pattern PR may be controlled to be about 0.0001 mm to 0.2 mm, thereby implementing uniform light distribution and excellent light converging characteristics.

The height of the curvature pattern PR of the first and second light diffusion patterns P1 and P2 may be about 0.3 mm or less.

For example, the height of the curvature pattern PR may be about 0.0001 mm to 0.3 mm.

If the height of the curvature pattern PR exceeds 0.3 mm, the light converging characteristic may be bad.

In the embodiment, when the height of the curvature pattern PR is controlled to be about 0.3 mm or less, for example, 0.2 mm or less, excellent light collection characteristics and uniform light distribution can be implemented.

The centers of the respective light diffusion patterns P1 and P2 and the centers of the light emitting chips 121 and 122 in the top view of the lens unit 230 can be matched.

For example, in the embodiment, by controlling the alignment tolerance of the first and second light diffusion patterns P1 and P2 and the light emitting chips 121 and 122 of the lens part 230 to about 25 μm or less, the uniformity of light distribution can be obtained in addition to the wide angle of view (FOV) realization by remarkably improving the correspondence between the directivity angle characteristics of light and the light diffusion pattern of the lens portion.

For example, in the embodiment, since the alignment tolerance between the centers of the curvature patterns PR of the first and second light diffusion patterns P1 and P2 and the light emitting chips 121 and 122 of the lens part 232 is about 25 μm, the uniformity of light distribution can be obtained in addition to the implementation of the wide angle viewing angle (FOV) by remarkably improving the coincidence of the light directing characteristic of the light emitted from the light emitting chip and the light diffusion pattern of the lens portion.

In an embodiment, the light output portion 232a may include a glass material, and the pattern portion 232b may be formed of a plastic material.

For example, the light output portion 232a may be formed of sapphire, and the pattern portion 232b may be made of an acrylic plastic material. Examples of the pattern portion 232b include polymethyl methacrylate (PMMA), but it is not limited thereto.

The pattern unit 232b may be formed by a thermal process or an imprinting process using a pattern transfer method by UV irradiation, but it is not limited thereto.

According to the embodiment, since the pattern portion 232b is imprinted after the light output portion 232a is reflowed at a temperature of about 260° C. or more, distortion of the pattern does not occur, the pattern can be maintained.

According to the embodiment, since the light output portion 232a of the second light diffusion portion 232 exposed to the outside is formed of a glass material, the embodiment can provide a camera module having the lens portion having high resistance against scratches that may occur during the process or during use, and a terminal including the same.

According to the embodiment described above, the following technical effect is obtained.

The embodiment can provide a flash module, a camera module, and a terminal including the same, which have a super slim technical effect while maintaining a wide angle.

Also, the embodiment can provide a flash module, a camera module and a terminal including the same, wherein the end portion of the pattern of the lens has a sharp technical characteristic.

In addition, the embodiment can provide a flash module, a camera module, and a terminal including the flash module with a lens portion having high scratch resistance.

Also, the embodiment includes a light emitting module, a flash module, a camera module and a camera module having a technical effect capable of integrating warm-white and cool-white.

In addition, the embodiment can provide a light emitting module, a flash module, a camera module, and a terminal including the same excellent in reliability according to a high heat radiation effect in a flash operation of the light emitting module.

In addition, the embodiment can provide a light emitting module, a flash module, a camera module, and a terminal including the same having a high alignment accuracy of the light emitting chip and the flash lens and achieving a uniform light distribution.

Also, the embodiment can provide a light emitting module, a flash module, a camera module, and a terminal including same having the technical effect that the coupling relation between the light emitting module and the frame is robust and the mechanical reliability is improved.

The features, structures, effects and the like described in the embodiments are included in at least one embodiment and are not necessarily limited to only one embodiment.

Furthermore, the features, structures, effects and the like illustrated in the embodiments can be combined and modified by other persons skilled in the art to which the embodiments belong.

Accordingly, the contents of such combinations and modifications should be construed as being included in the scope of the embodiments.

While the present invention has been particularly shown and described with reference to embodiments thereof, it will be understood by those skilled in the art that various changes in form and details may be made therein without departing from the spirit and scope of the invention. It can be seen that the modification and application of branches are possible.

For example, each component specifically shown in the embodiment can be modified and implemented.

It is to be understood that the present invention may be embodied in many other specific forms without departing from the spirit or essential characteristics thereof.

INDUSTRIAL APPLICABILITY

The flash module according to the embodiment may be employed in a terminal.

The terminal may include a cellular phone, a smart phone, a tablet PC, a notebook, a PDA (Personal Digital Assistant), and the like, but it is not limited thereto.

The invention claimed is:

1. A light emitting module comprising:
a plurality of light emitting chips having a semiconductor layer, a phosphor layer disposed on one surface of the semiconductor layer and a plurality of electrodes disposed on a surface of the semiconductor layer facing the one surface;
a first partition disposed on one side of the plurality of light emitting chips;
a second partition disposed on the other side of the plurality of light emitting chips so as to face the first partition; and
an opaque molding part surrounding the plurality of light emitting chips and disposed inside the first and second partitions so that a top surface of the phosphor layer and a bottom surface of the plurality of electrodes are exposed to an outside,
wherein the opaque molding part surrounds the sides of the plurality of light emitting chips,
wherein the opaque molding part surrounds the sides of phosphor layer, and
wherein the top surface of the phosphor layer and a top surface of the opaque molding part are at a same height.

2. The light emitting module according to claim 1, wherein the first partition and the second partition surround the plurality of light emitting chips, and the plurality of light emitting chips include a first light emitting chip and a second light emitting chip having a different color temperature (CCT).

3. The light emitting module according to claim 2, wherein the first light emitting chip comprises,
a first phosphor layer disposed on an upper surface of a first semiconductor layer; and
a first n-type electrode and a first p-type electrode disposed on a bottom surface of the first semiconductor layer, and
wherein at least one portion of bottom surfaces of the first n-type electrode and the first p-type electrode are exposed to a bottom surface of the opaque molding part.

4. A flash module comprising:
a light emitting module including a plurality of light emitting chips each including a semiconductor layer, a phosphor layer disposed on one surface of the semiconductor layer, a plurality of electrodes disposed on a surface of the semiconductor layer facing the one surface, and a molding part for surrounding the plurality of light emitting chips;
a frame disposed on the light emitting module; and
a lens portion disposed on the frame,
wherein the lens portion includes a light diffusion portion in which a predetermined pattern is disposed, and a lens support portion disposed in contact with an outer side of the light diffusion portion, and wherein the light diffusion portion includes a glass material, wherein the frame includes a first frame and a second frame whose cross-sections are mutually spaced, and the light emitting module is disposed between the first frame and the second frame, wherein the light emitting module further includes a first partition disposed on one side of the plurality of light emitting chips, and a second partition disposed on the other side of the plurality of light emitting chips so as to face the first partition, wherein the first frame includes a first support portion and a first inner protrusion portion disposed on the first support portion, and wherein the second frame includes a second support portion and a second inner protrusion portion disposed on the second support portion, and wherein the first partition and the second partition of the light emitting module are in contact with an inner surface of the first support portion and an inner surface of the second support portion, respectively.

5. The flash module according to claim 4, wherein the light diffusing portion of the lens portion includes a pattern portion in which a pattern is disposed and a light output portion through which light from the light emitting chip is emitted.

6. The flash module according to claim 4, wherein the plurality of light emitting chips include first and second flip-type light emitting chips having a different color temperature (CCT).

7. A terminal comprising a flash module according to claim 4.

8. The flash module according to claim 4, wherein the first partition and the second partition of the light emitting module are in contact with a bottom surface of the first inner protruding portion and a bottom surface of the second inner protruding portion.

9. The flash module according to claim 8, wherein the first frame includes a third inner protruding portion disposed on the first inner protruding portion and a first outer protruding portion disposed on the third inner protruding portion.

10. The flash module according to claim 9, wherein the second frame includes a fourth inner protruding portion disposed on the second inner protruding portion and a second outer protruding portion disposed on the fourth inner protruding portion.

11. The flash module according to claim 10, wherein the lens portion contacts the third inner protruding portion and the fourth inner protruding portion.

12. A flash module comprising:
a light emitting module including a first partition and a second partition spaced apart from each other, a first light emitting chip and a second light emitting chip disposed between the first partition and the second partition, and an opaque molding part between the first partition and the second partition;
a frame disposed on the light emitting module; and
a lens unit disposed on the frame,
wherein the first light emitting chip and the second light emitting chip are flip-type light emitting chips,
wherein a part of the flip-type first light emitting chip or the flip-type second light emitting chip is exposed to a bottom surface of the opaque molding part,
wherein the frame includes a first frame and a second frame whose cross-sections are mutually spaced, and the light emitting module is disposed between the first frame and the second frame,
wherein the first frame includes a first support portion and a first inner protrusion portion disposed on the first support portion, and
wherein a top surface of the phosphor layer and a top surface of the first and second partitions are at a same height.

13. The flash module according to claim 12, wherein the frame includes a predetermined recess on an outer side, and
wherein a center axis of the predetermined recess passes through the flip-type first light emitting chip and the flip-type second light emitting chip.

14. The flash module according to claim 12, wherein the second frame includes a second support portion and a second inner protrusion portion disposed on the second support portion.

15. The flash module according to claim 14, wherein the first partition and the second partition of the light emitting module are in contact with an inner surface of the first support portion and an inner surface of the second support portion.

16. The flash module according to claim 15, wherein the first frame includes a third inner protruding portion disposed on the first inner protruding portion and a first outer protruding portion disposed on the third inner protruding portion.

17. The flash module according to claim 16, wherein the second frame includes a fourth inner protruding portion disposed on the second inner protruding portion and a second outer protruding portion disposed on the fourth inner protruding portion, and
wherein the lens portion contacts the third inner protruding portion and the fourth inner protruding portion.

18. A flash module comprising:
a light emitting module including a plurality of light emitting chips each including a semiconductor layer, a phosphor layer disposed on one surface of the semiconductor layer, a plurality of electrodes disposed on a surface of the semiconductor layer facing the one surface, and a molding part for surrounding the plurality of light emitting chips;
a frame disposed on the light emitting module; and
a lens portion disposed on the frame,
wherein the lens portion includes a light diffusion portion in which a predetermined pattern is disposed, and a lens support portion disposed in contact with an outer side of the light diffusion portion, and wherein the light diffusion portion includes a glass material,
wherein the frame includes a first frame and a second frame whose cross-sections are mutually spaced, and the light emitting module is disposed between the first frame and the second frame,
wherein the first frame includes a first support portion and a first inner protrusion portion disposed on the first support portion, and
wherein a height of the upper surface of the lens unit is the same as the height of an upper surface of the frame.

* * * * *